(12) United States Patent
Hirano

(10) Patent No.: US 9,594,312 B2
(45) Date of Patent: Mar. 14, 2017

(54) PROCESSING APPARATUS, PROCESSING METHOD, AND DEVICE MANUFACTURING METHOD

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/834,742

(22) Filed: Aug. 25, 2015

(65) Prior Publication Data

US 2016/0064266 A1  Mar. 3, 2016

(30) Foreign Application Priority Data

Aug. 29, 2014 (JP) ................................. 2014-175448

(51) Int. Cl.
| | |
|---|---|
| G03B 27/58 | (2006.01) |
| G03B 27/60 | (2006.01) |
| G03F 7/20 | (2006.01) |
| H01L 21/683 | (2006.01) |
| G03F 7/32 | (2006.01) |

(Continued)

(52) U.S. Cl.
CPC ............ *G03F 7/70733* (2013.01); *G03F 7/20* (2013.01); *G03F 7/32* (2013.01); *G03F 7/707* (2013.01); *G03F 7/70725* (2013.01); *G03F 7/70758* (2013.01); *G03F 7/70775* (2013.01);

(Continued)

(58) Field of Classification Search
CPC .. G03F 7/70733; G03F 7/707; G03F 7/70708; G03F 7/70716; G03F 7/70725; G03F 7/70741; G03F 7/7075; G03F 7/70525; G03F 7/70533; G03F 7/70758;

(Continued)

(56) References Cited

U.S. PATENT DOCUMENTS

| | | | | |
|---|---|---|---|---|
| 5,923,408 | A | * 7/1999 | Takabayashi | ........... G03F 7/707 269/21 |
| 2005/0012919 | A1 | * 1/2005 | Uemura | ............... B41J 11/0085 355/72 |

(Continued)

FOREIGN PATENT DOCUMENTS

| | | |
|---|---|---|
| EP | 0420551 A1 | 4/1991 |
| EP | 2006899 A2 | 12/2008 |

(Continued)

OTHER PUBLICATIONS

Extended European Search Report issued in European Appln. No. 15002510.4 mailed Aug. 1, 2016.

(Continued)

*Primary Examiner* — Christina Riddle
(74) *Attorney, Agent, or Firm* — Rossi, Kimms & McDowell LLP

(57) ABSTRACT

A processing apparatus that performs processing to a wafer is provided, the processing apparatus comprising a wafer chuck disposed on a stage and that holds the wafer; three pins that attract the wafer and move the wafer from the wafer chuck; and a control unit that is configured to stop or decrease the attraction of the three pins based on information about a through hole of the wafer when the wafer is moved from the wafer chuck by the three pins.

15 Claims, 17 Drawing Sheets

(51) Int. Cl.
*H01L 21/677* (2006.01)
*H01L 21/687* (2006.01)

(52) U.S. Cl.
CPC .... *H01L 21/67748* (2013.01); *H01L 21/6838* (2013.01); *H01L 21/6875* (2013.01)

(58) Field of Classification Search
CPC .......... G03F 7/70775; H01L 21/67748; H01L 21/6838; H01L 21/6875
USPC .... 355/52, 53, 55, 72–77; 250/492.1, 492.2, 250/492.22, 492.23, 493.1, 548, 442.11; 414/751.1, 752.1
See application file for complete search history.

(56) References Cited

U.S. PATENT DOCUMENTS

| | | | |
|---|---|---|---|
| 2007/0176445 A1 | 8/2007 | Kim | |
| 2009/0033906 A1 | 2/2009 | Kumazaki | |
| 2009/0218460 A1 | 9/2009 | Nakamura et al. | |

FOREIGN PATENT DOCUMENTS

| | | | |
|---|---|---|---|
| JP | 2002217276 A | * | 8/2002 |
| JP | 2004273965 A | | 9/2004 |
| JP | 2008251754 A | | 10/2008 |
| JP | 2013191601 A | | 9/2013 |

OTHER PUBLICATIONS

ESR issued in European Appln. No. 15002510.4 mailed Mar. 29, 2016.

\* cited by examiner

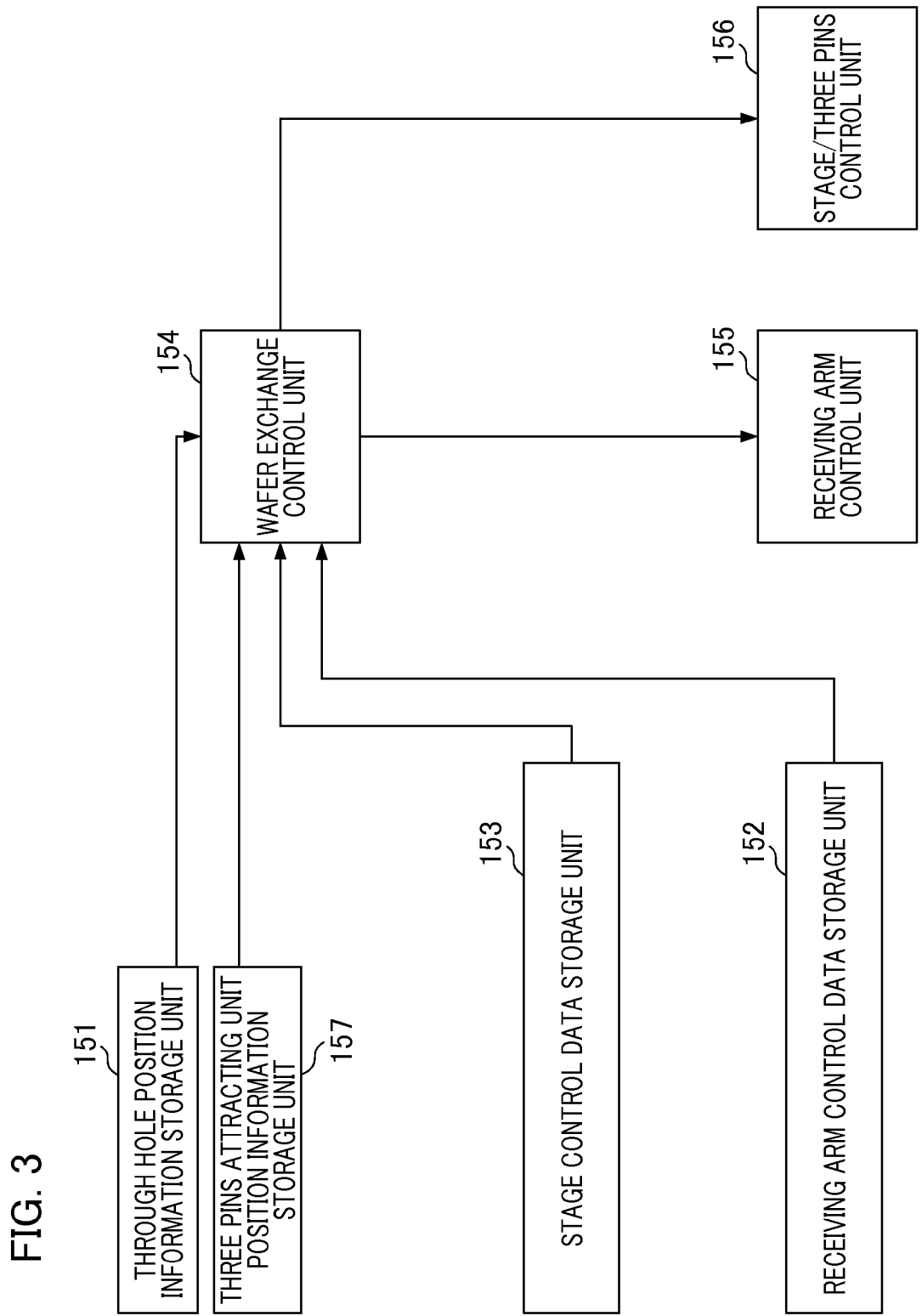

PROCESSING APPARATUS, PROCESSING METHOD, AND DEVICE MANUFACTURING METHOD

BACKGROUND OF THE INVENTION

Field of the Invention

The present invention relates to a processing apparatus, a processing method, and a device manufacturing method.

Description of the Related Art

Conventionally, a semiconductor exposure apparatus used for the manufacture of a semiconductor element has, for example, a wafer transfer hand that supplies a wafer with a wafer stage and collects the wafer, a pre-alignment stage, and a wafer stage transfer robot. In the pre-alignment stage, before the wafer is moved to the wafer stage, the alignment of the wafer is performed by using a notch or an orientation flat. The wafer stage transfer robot holds the wafer by using vacuum pressure and transfers it. Japanese Patent Laid-Open No. 2008-251754 discloses a pin that holds the wafer above the wafer stage and a pin drive mechanism used when the wafer is supplied and collected by the wafer transfer hand.

In recent years, the manufacture of micro electro mechanical systems (MEMS) has been performed by applying the manufacturing technique of such a semiconductor integrated circuit. "MEMS" refer to devices in which a machine element component, a sensor, an actuator, an electronic circuit, and the like are integrated on a silicon substrate, a glass substrate, an organic material, or the like.

In this connection, unlike conventional semiconductor devices, in the MEMS, mechanical processing is usually performed on a semiconductor member as a target, and, for example, there are cases in which through holes are formed from the surface to the back of the wafer. In a case where the technique disclosed in Japanese Patent Laid-Open No. 2008-251754 is used for the manufacture of the MEMS, there are cases in which an attracting force cannot be sufficiently obtained if the through holes and the attracting units are overlapped for a wafer in which through holes have been formed. When the attracting force cannot be sufficiently obtained, the apparatus may stop due to attraction abnormalities. Additionally, a vacuum source pressure may vary due to the leakage of attracting air, and the attraction by another attraction holding mechanism connected to the identical vacuum source pressure may be decreased. When the apparatus stops, throughput of the apparatus decreases, and when the attracting force decreases, it will affect the reliability of the apparatus.

SUMMARY OF THE INVENTION

The present invention provides, for example, a processing apparatus that is advantageous in throughput or reliability even if a substrate formed with a through hole is processed.

According to an aspect of the present invention, a processing apparatus that performs processing to a substrate is provided, the processing apparatus comprising: a chuck disposed on a stage and that holds the substrate; an attracting unit that attracts the substrate and moves the substrate from the chuck; and a control unit configured to stop or decrease attraction of the attracting unit based on information about a through hole of the substrate in a case where the substrate is moved from the chuck by the attracting unit.

Further features of the present invention will become apparent from the following description of exemplary embodiments (with reference to the attached drawings).

BRIEF DESCRIPTION OF THE DRAWINGS

FIG. 3 illustrates a configuration of a control unit.

DESCRIPTION OF THE EMBODIMENTS

Hereinafter, embodiments for practicing the present invention will be described with reference to drawings and the like. Although the present invention is applicable to a processing apparatus that performs processing on a substrate held by a chuck disposed on a stage, a description will be given by using an example of an exposure apparatus that performs exposure processing on the substrate.

Figure 1:
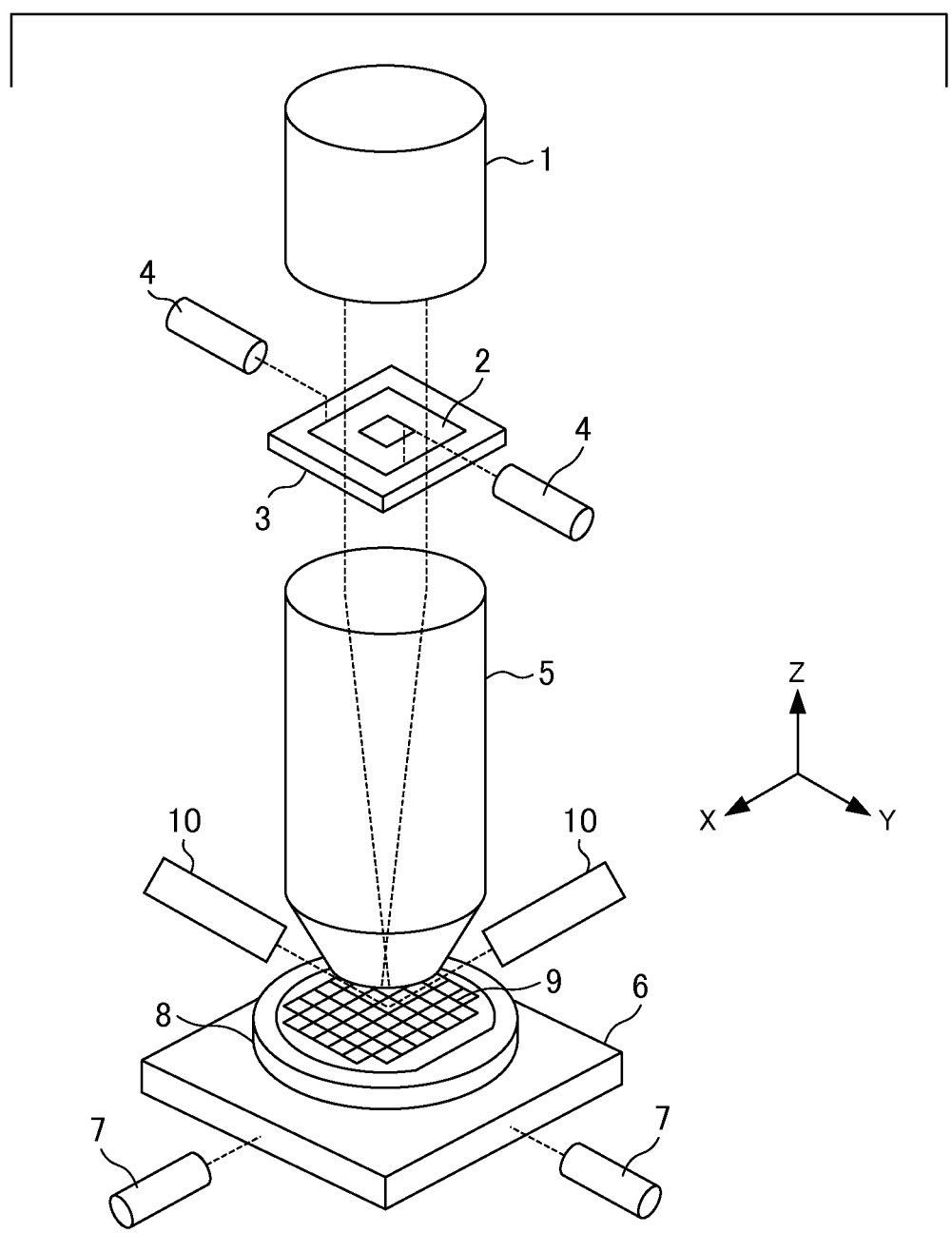
FIG. 1 illustrates a configuration of an exposure apparatus according to the present invention.

As shown in FIG. 1, the exposure apparatus includes an illumination system. 1, a reticle stage 3 that holds a reticle 2, reticle position measuring units 4, and a projection optical system (a projection exposure lens) 5, a wafer stage (stage) 6 that holds a wafer (substrate) 9. The exposure apparatus further includes laser interferometers 7, a wafer chuck (chuck) 8 that vacuum-attracts the wafer, a wafer Z drive mechanism positioned at the lower part of the wafer chuck 8 (not illustrated), and auto-focus units 10 that measure the focus position of the wafer 9. The illumination system 1 includes a light source and a shutter. A circuit pattern is depicted on the reticle 2. The reticle position measuring units 4 measure the position of the reticle 2 on the reticle stage 3. The wafer stage 6 loads the wafer 9 to be exposed, and moves in two directions of X and Y in the XY-plane. The laser interferometers 7 measure the position of the wafer stage 6. The wafer Z drive mechanism is provided at the lower part of the wafer chuck 8, loads the wafer 9, and moves the wafer 9 in the perpendicular direction (Z direction) for the focus adjustment (focusing) during the exposure.

Figure 2A:
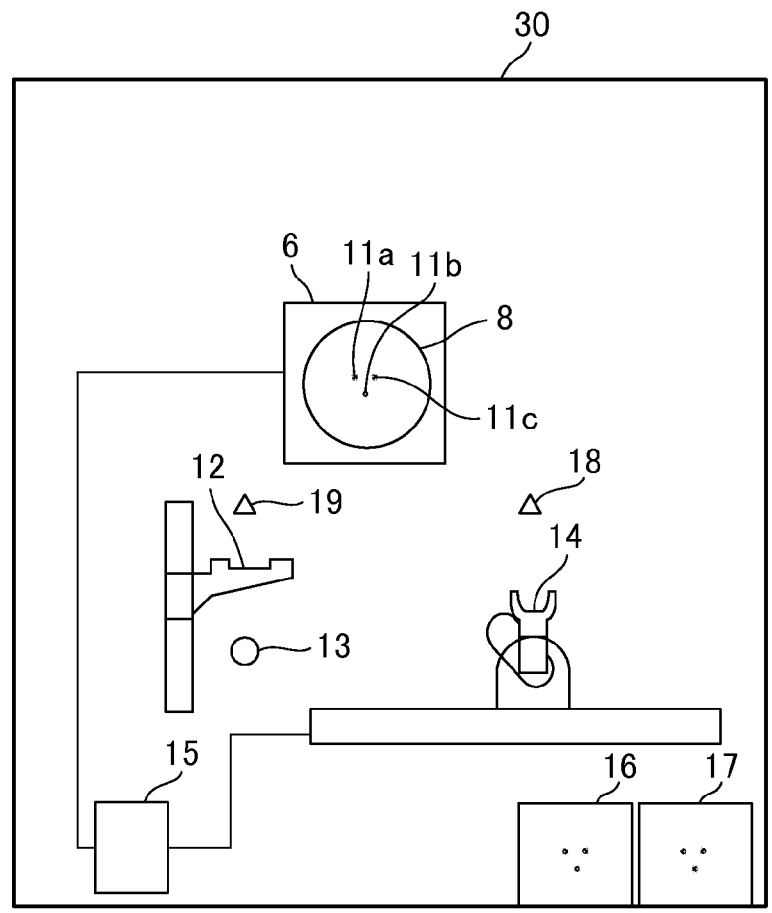
FIG. 2A is a top view illustrating the exposure apparatus.

FIG. 2A is a schematic diagram seen from the upper surface of the apparatus highlighting the portion relating to the transfer of the wafer 9 (FIG. 1) and the attraction of the wafer 9 by the wafer chuck 8. The exposure apparatus includes a chamber 30, the wafer chuck 8, three pins 11a, 11b, and 11c, the wafer stage 6, a wafer carry-in station 16, a wafer carry-out station 17, a control unit 15, and a pre-alignment unit 13. The exposure apparatus further includes a receiving arm (transfer unit) 14 that receives the wafer 9, and a delivery arm 12 that delivers the wafer 9.

The chamber 30 maintains the exposure environment at a constant temperature and humidity. The wafer chuck 8 vacuum-attracts the wafer 9 at the lower part of the projection exposure lens 5 (FIG. 1). The three pins 11a, 11b, and 11c move in the perpendicular direction for transferring the wafer 9 to the wafer chuck 8. The wafer stage 6 integrally moves the wafer 9, the wafer chuck 8, and the three pins 11a, 11b, and 11c in two directions of X and Y in the XY-plane (FIG. 1). In the wafer carry-in station 16, the wafer 9 on which the exposure processing has not been performed is carried in from the outside of the chamber 30, and disposed. In the wafer carry-out station 17, the wafer 9 on which the exposure processing has been performed is disposed, and carried out to the outside of the chamber 30. The control unit 15 is a computer that controls the exposure apparatus, and is electrically connected to the receiving arm 14, the wafer stage 6, and the like. The pre-alignment unit 13 performs the pre-alignment (preprocessing) of the wafer 9 prior to the exposure processing.

The receiving arm 14 transfers the wafer 9 that was carried in the wafer carry-in station 16 to the pre-alignment unit 13, and transfers the wafer 9 on which the exposure processing was performed and that was disposed on the three pins 11 to the wafer carry-out station 17. The delivery arm 12 transfers the wafer 9 on which the pre-alignment was performed by the pre-alignment unit 13 to the three pins 11.

The transfer of the wafer 9 between the wafer chuck 8 and the three pins 11a, 11b, and 11c is possible in both of a structure in which the three pins 11 are raised and lowered, and a structure in which the wafer chuck 8 is raised and lowered while the three pins 11a, 11b, and 11c stop. The control unit 15 may be configured by one computer, or may be configured by a plurality of computers. The three pins 11a, 11b, and 11c may be configured by four or more pins if the wafer 9 is movable in the perpendicular direction.

Next, a description will be given of the attraction of the wafer 9 by the wafer chuck 8. The delivery arm 12 delivers the wafer 9 to the three pins 11a, 11b, and 11c disposed on the wafer stage 6 at a wafer supply position 19. The receiving arm 14 receives the wafer 9 from the three pins 11a, 11b, and 11c disposed on the wafer stage 6 at a wafer collection position 18. The wafer collection position 18 and the wafer supply position 19 only indicate the position of the wafer stage 6 at which each processing is executed.

Figure 2B:
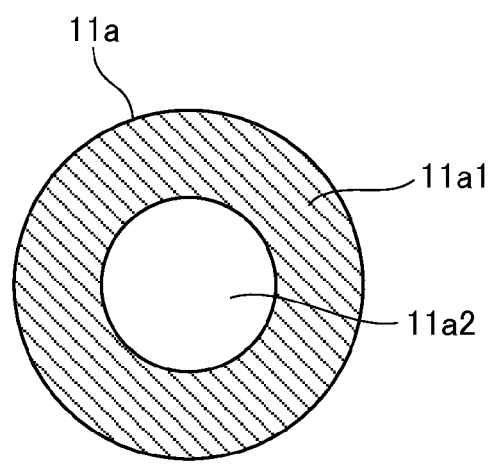
FIG. 2B is an enlarged view of one of three pins.
Figure 2C:
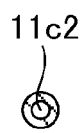
FIG. 2C is an explanatory drawing of the three pins.
Figure 2D:
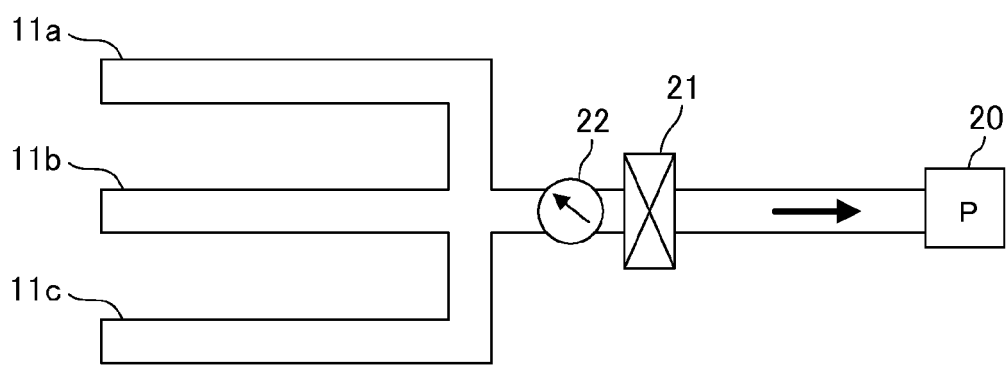
FIG. 2D illustrates the operation of the three pins.

Next, a description will be given of a configuration of the three pins 11a, 11b, and 11c serving as the attracting unit. FIG. 2B is an enlarged view of the pin 11a among the three pins, 11a, 11b, and 11c. The pin 11a includes a wafer holding unit 11a1, and an attracting hole 11a2 that sucks air. As shown in FIG. 2C, the other pins 11b and 11c are also provided with the same structure as the pin 11a. FIG. 2D is an explanatory view of an example of a suction means including the three pins 11a, 11b, and 11c. The suction means is configured by the three pins 11a, 11b, and 11c, a suction pump 20 that sucks air, an opening and closing valve 21 that opens and closes a suction state, and a pressure gauge 22 that measures the suction state. Branch pipes are connected to each of the three pins 11a, 11b, and 11c, wherein the three branch pipes are connected to a single main pipe. The main pipe is provided with the opening and closing valve 21 and the pressure gauge 22, and is connected to the suction pump 20. The suction pump 20, the opening and closing valve 21, and the pressure gauge 22 are electrically connected to the control unit 15 (FIG. 2A), and they are controlled by the control unit 15.

Figure 2E:
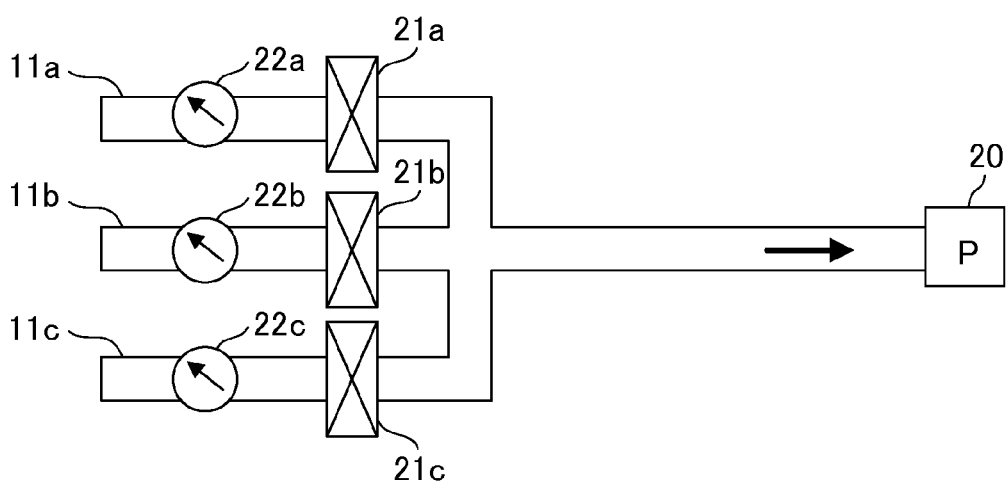
FIG. 2E illustrates the operation of the three pins.

FIG. 2E is a diagram that explains another example of the configuration of the suction means including the three pins 11a, 11b and 11c serving as the attracting unit. The suction means is configured by the three pins 11a, 11b, and 11c, the suction pump 20 that sucks air, the opening and closing valves 21a, 21b, and 21c that open and close the suction state, and pressure gauges 22a, 22b, and 22c that measure the suction state. The branch pipes are connected to each of the three pins 11a, 11b, and 11c, wherein these three branch pipes are connected to a position information single main pipe. Each of the branch pipes is provided with the opening and closing valves 21a, 21b, and 21c and the pressure gauges 22a, 22b, and 22c. The main pipe is connected to the suction pump 20. The suction pump 20, the opening and closing valves 21a, 21b, and 21c, and the pressure gauges 22a, 22b, and 22c are electrically connected to the control unit 15 (FIG. 2A), and they are controlled by the control unit 15.

FIG. 3 illustrates a configuration of the control unit 15. The control unit 15 includes a through hole position information storage unit 151, a receiving arm control data storage unit 152, and a stage control data storage unit 153. In addition to this, the control unit 15 includes a wafer exchange control unit 154, a receiving arm control unit 155, a stage/three pins control unit 156, and a three pins attracting unit position information storage unit 157. The through hole position information storage unit 151 holds information about the presence or absence and the positions of the through holes of the wafer set as an exposure procedure information specified in lot units. The through hole position information storage unit 151 further transmits the information about the presence or absence and the positions of the through holes that are being held to the wafer exchange control unit 154. The three pins attracting unit position information storage unit 157 holds the position information about the attracting holes 11a2, 11b2, and 11c2 of the three pins 11a, 11b, and 11c (hereinafter, referred to as three pins attracting unit position information). Note that the position information about the attracting holes 11a2, 11b2, and 11c2 is information that is unique to the processing apparatus. The three pins attracting unit position information storage unit 157 further transmits the three pins attracting unit position information that is being held to the wafer exchange control unit 154.

The receiving arm control data storage unit 152 stores control profile information about the receiving arm 14 when the receiving arm 14 moves to the wafer collection position 18 for receiving the wafer 9 from the standby position. The control profile information about the receiving arm 14 specifically includes information including the speed, the acceleration, and the operation duration of the movement of the receiving arm. The receiving arm control data storage unit 152 transmits the control profile information about the receiving arm 14 to the wafer exchange control unit 154. The stage control data storage unit 153 stores the control profile information about the three pins 11a, 11b, and 11c. The control profile information about the three pins 11a, 11b, and 11c specifically includes information about, for example, the speed, the acceleration, and the operation duration of the movement of the three pins 11a, 11b and 11c. The stage control data storage unit 153 transmits the control profile information about the three pins, 11a, 11b, and 11c to the wafer exchange control unit 154.

The wafer exchange control unit 154 receives the control profile information about the receiving arm 14 from the receiving arm control data storage unit 152, and receives the control profile information about the three pins 11a, 11b and 11c from the stage control data storage unit 153. The wafer exchange control unit 154 further transmits a command to the receiving arm control unit 155 and the stage/three pins control unit 156 on the basis of the information received from the through hole position information storage unit 151 and the three pins attracting unit position information storage unit 157. Specifically, the wafer exchange control unit 154 performs the control such that a time required for the wafer exchange becomes minimum while avoiding the collision between the three pins 11a, 11b, and 11c and receiving arm 14. The receiving arm control unit 155 controls the receiving arm 14, based on the command from the wafer exchange control unit 154. The stage/three pins control unit 156 controls the wafer stage 6 and the three pins 11a, 11b, and 11c, based on the command from the wafer exchange control unit 154.

Figure 4A:
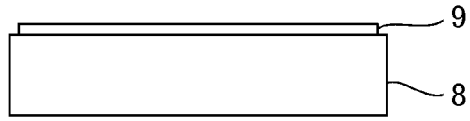
FIGS. 4A to 4E illustrate the operation of transferring a wafer from the three pins to a receiving arm.
Figure 4B:
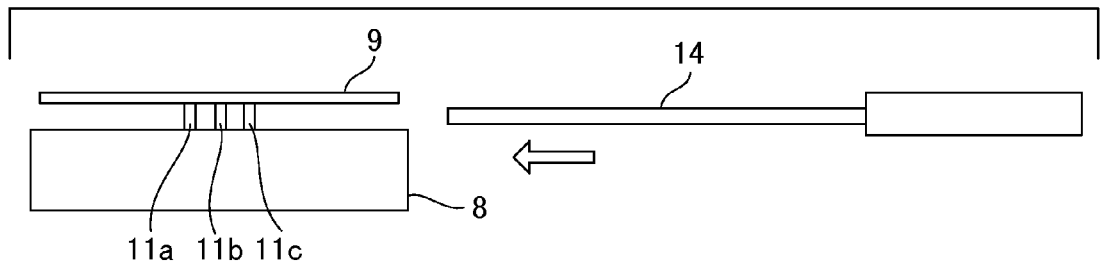
Figure 4C:
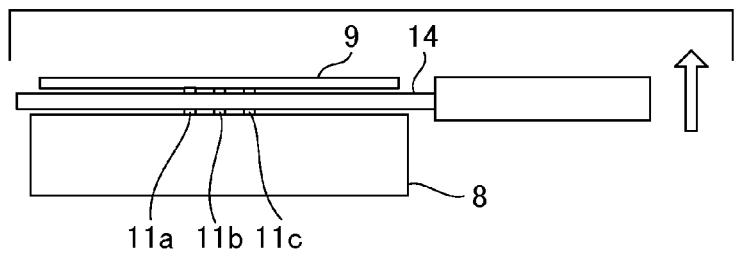
Figure 4D:
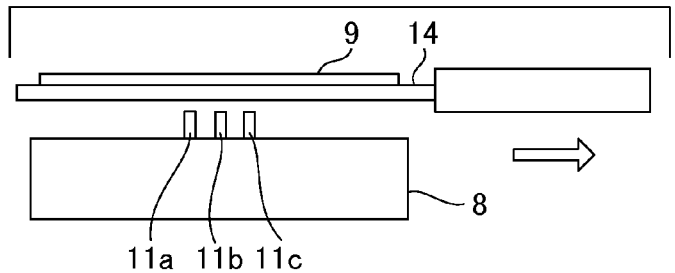
Figure 4E:
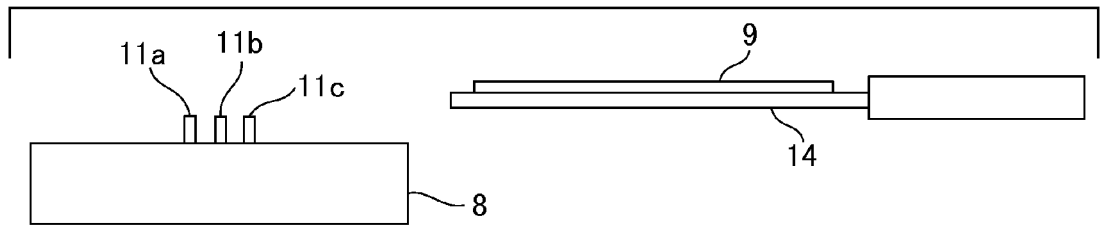

FIGS. 4A to 4C illustrate a process in which the receiving arm 14 receives the exposed wafer 9 disposed on the wafer chuck 8 from the three pins 11a, 11b, and 11c, seen from the lateral direction, and they are schematic diagrams illustrating the movement in time series. In FIG. 4A, the attracting holding of the exposed wafer 9 disposed on the wafer chuck 8 is released. In FIG. 4B, the three pins 11a, 11b, and 11c move in a perpendicular direction, that is, they move perpendicular to the surface of the wafer chuck 8, abut on the lower surface of the wafer 9, and lift the wafer 9 above the wafer chuck 8. Here, when the three pins 11a, 11b, and 11c move upward, either moving while performing the attraction of the wafer 9 or moving without performing the attracting is selected based on the information about the through holes on the wafer 9. In FIG. 4C, the receiving arm 14 is inserted between the wafer chuck 8 and the wafer 9. In FIG. 4D, the receiving arm 14 moves upward and holds the wafer 9. In FIG. 4E, the receiving arm 14 receives the wafer 9 that is being held.

Figure 5:
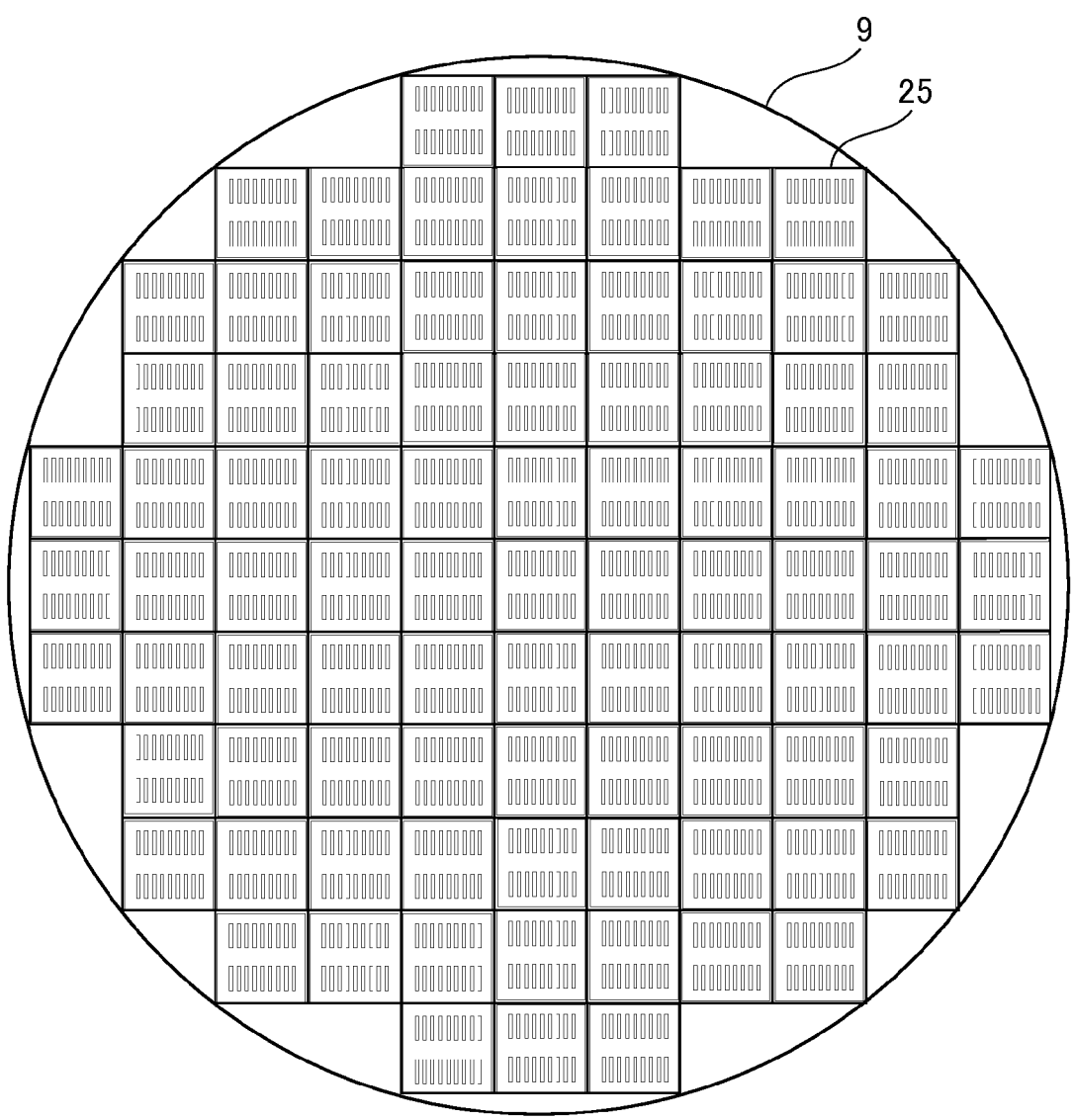
FIG. 5 illustrates an example of the wafer having through holes.
Figure 6:
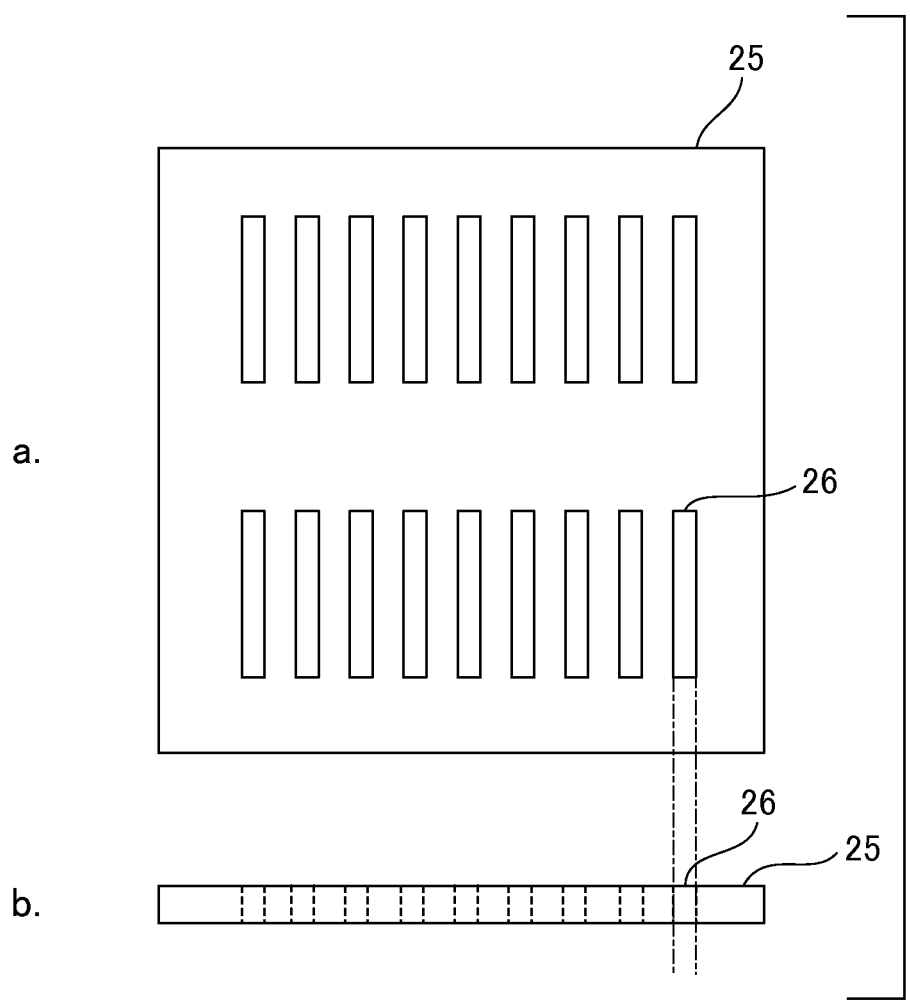
FIG. 6 is an enlarged view of a unit shot.

FIG. 5 illustrates an example of a layout of the wafer 9 having through holes 26. FIG. 6 is an enlarged view of a unit shot 25 in FIG. 5. "a" of FIG. 6 indicates a state in which the unit shot 25 is seen from above, and "b" of FIG. 6 indicates a state in which the unit shot 25 is seen from the lateral direction. As shown in FIG. 5 and FIG. 6, a large number of unit shots 25 are arranged in the layout of the wafer 9, and the each unit shot 25 includes the through holes that are a large number of long holes. The through holes 26 penetrate from the front surface to the back surface of the unit shot 25 in the wafer 9 (FIG. 5) as shown in "b" of FIG. 6.

Figure 7:
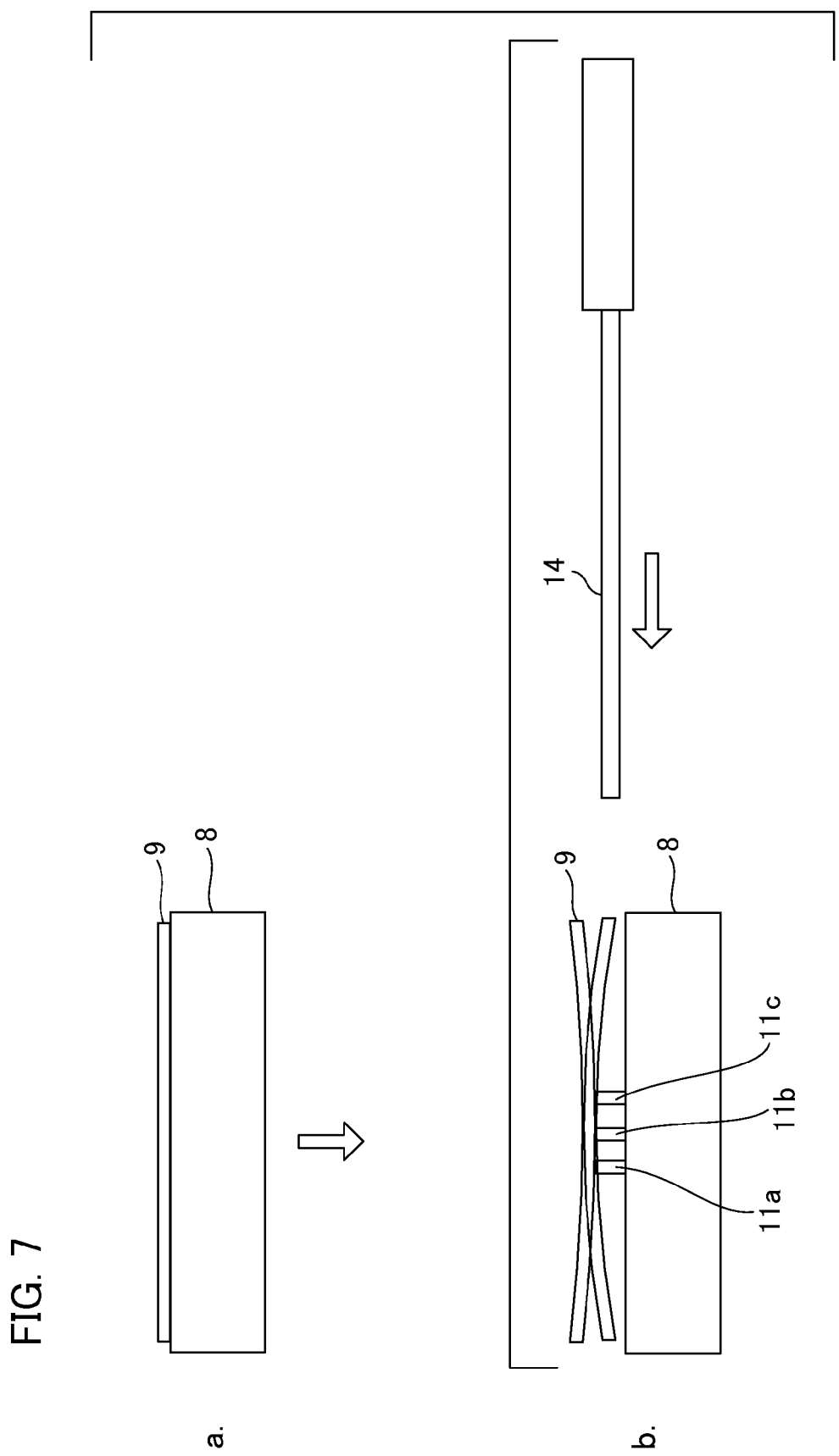
FIG. 7 is a diagram schematically explaining vibrations of the wafer.

FIG. 7 illustrate a process in which the receiving arm 14 receives the exposed wafer 9 disposed on the wafer chuck 8 from the three pins 11a, 11b, and 11c, which are seen from the lateral direction, and it is a schematic diagram illustrating the movement in time series. In "a" of FIG. 7, the attraction of the exposed wafer 9 disposed on the wafer chuck 8 is released. Subsequently, "b" of FIG. 7 illustrates a state in which the three pins 11a, 11b, and 11c move upward in a state in which the attraction is stopped, and the lifting of the wafer 9 upward of the wafer chuck 8 is completed. In this case, the peripheral portion of the wafer 9 is vibrating vertically around the three pins 11a, 11b, and 11c. After this, the receiving arm 14 inserts between the wafer 9 and the wafer stage 6.

Figure 8:
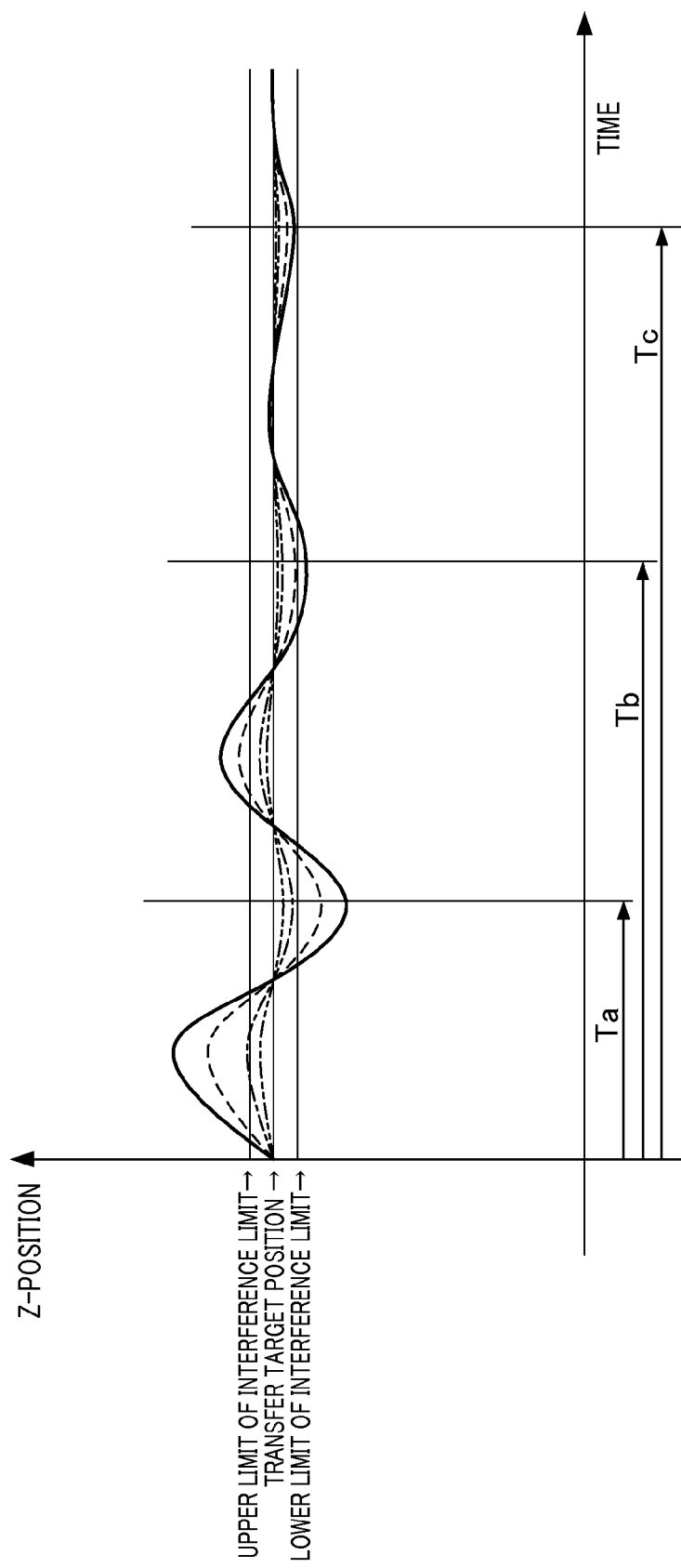
FIG. 8 is a graph explaining the attenuation of the vibrations of the wafer.

FIG. 8 is a graph illustrating the degree of attenuation of the vibrations of the wafers 9 in response to the elapsed time in a case where the attracting forces due to the three pins are different. The solid line indicates the vibration state at a specific position of the wafer 9 when the wafer 9 is received from the wafer chuck 8, in a case where the attracting force is smallest, or the three pins are not attracted. Similarly, the broken lines indicate the vibration state in a case where the attracting force lasts larger than the attracting force shown by the solid line, the dashed-dotted lines indicate the vibration state in a case where the attracting force is larger than the attracting force shown by the broken lines, and the dashed-two dotted lines indicate the vibration state in a case where the attracting force is largest.

In the case of the solid line, that is, in regard to the vibrations of the wafer 9 in the case where the attracting force is the smallest or no attracting is performed at the three pins, a time required for falling between the upper limit of the interference limit and the lower limit of the interference limit becomes Tc. Similarly, in case of the broken lines, the time required for falling between the upper limit of the interference limit and the lower limit of the interference limit becomes Tb, and in case of the dashed-dotted lines, the time required for falling between the upper limit of the interference limit and the lower limit of the interference limit becomes Ta. In case of the dashed-two dotted lines, that is, when the attracting force is largest, the vibrations of the wafer 9 cannot exceed the upper limit of the interference limit and the lower limit of the interference limit. When the vibrations are falling between the upper limit of the interference limit and the lower limit of the interference limit, the receiving arm 14 does not interfere with the wafer 9 if the receiving arm 14 is inserted. The relation of the attracting force and the time required for stabilizing the vibrations (stabilization time) is determined in advance by an experiment, and the control unit 15 holds it as a table of the attracting force and the stabilization time. Note that the control unit 15 may hold these values as approximate functions, rather than the table of the attracting force and the stabilization time.

Figure 9:
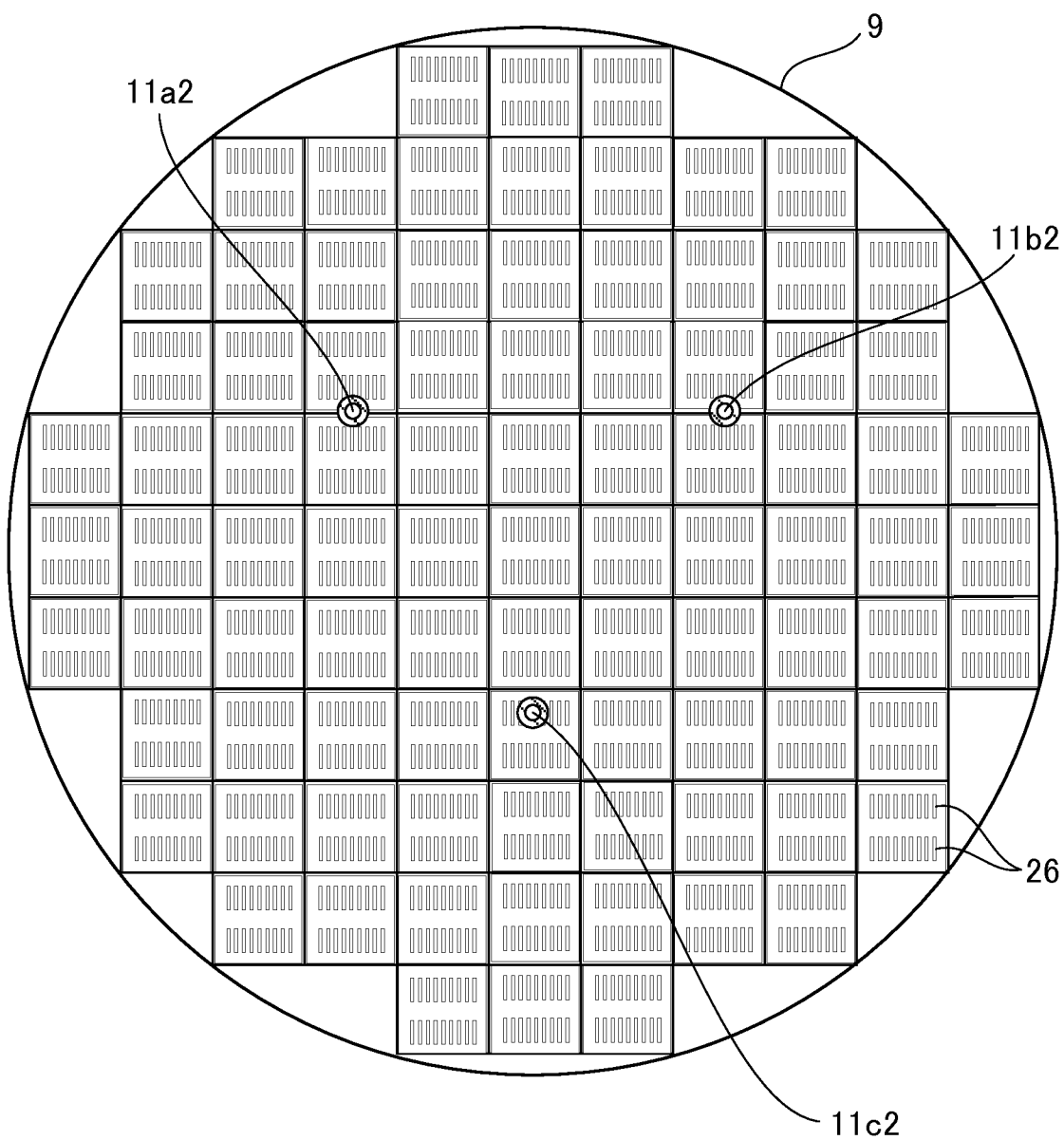
FIG. 9 illustrates an example of a positional relation between the three pins and the through holes.

FIG. 9 illustrates an example of the positional relation between the through holes 26 and the attracting holes 11a2, 11b2, and 11c2 in the wafer 9. In this layout of the wafer 9, the attracting holes 11a2 and 11b2 do not overlap with the through holes 26, and the attracting hole 11c2 overlaps with the through holes 26.

Figure 10:
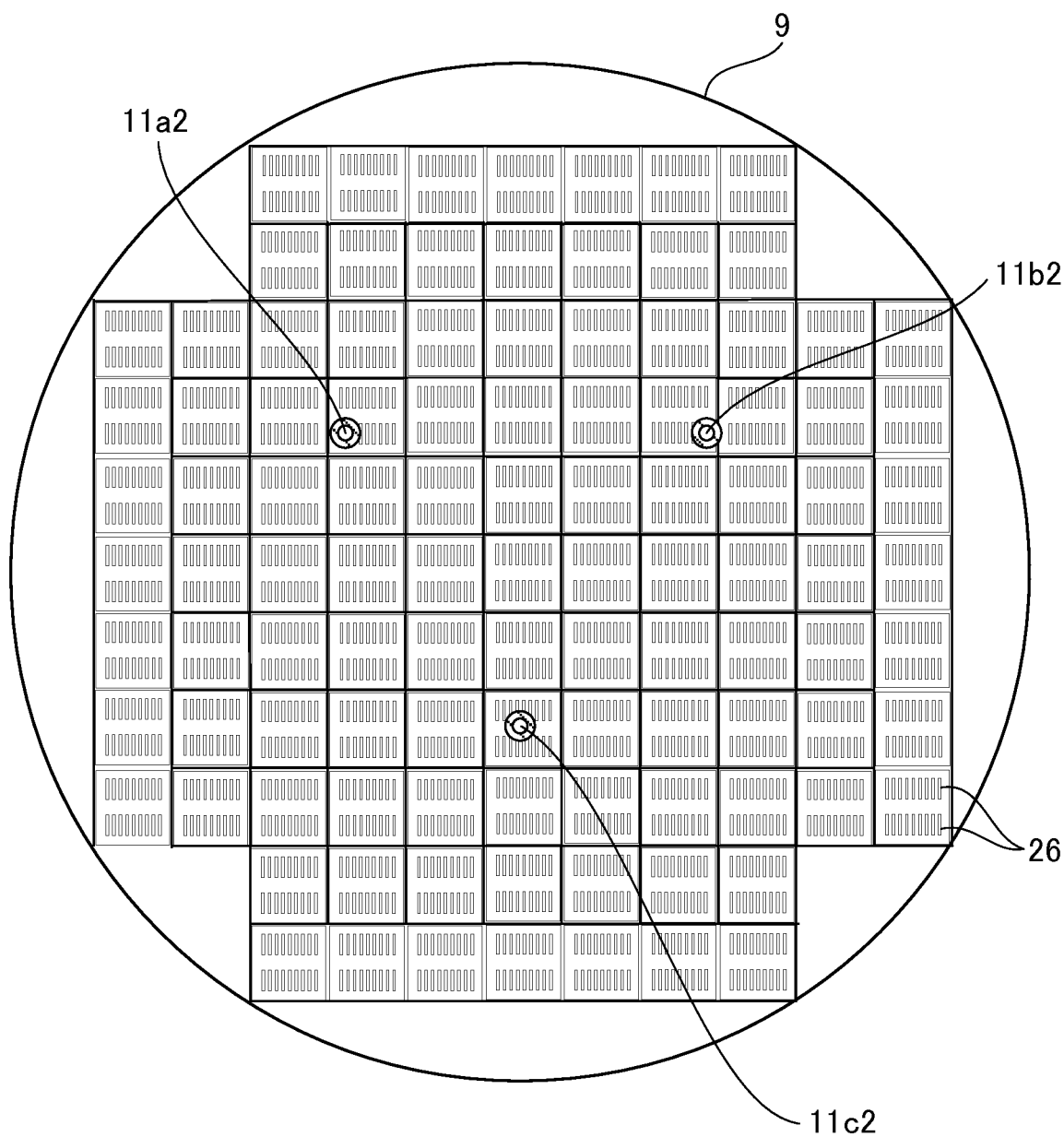
FIG. 10 illustrates another example of a positional relation between the three pins and the through holes.

FIG. 10 illustrates another example of the positional relation between the through holes 26 and the attracting holes 11a2, 11b2, and 11c2 in the wafer 9. In this layout of the wafer 9, the attracting holes 11a2 and 11b2 overlap with the through holes 26, and the attracting hole 11c2 does not overlap with the through holes 26.

Figure 11:
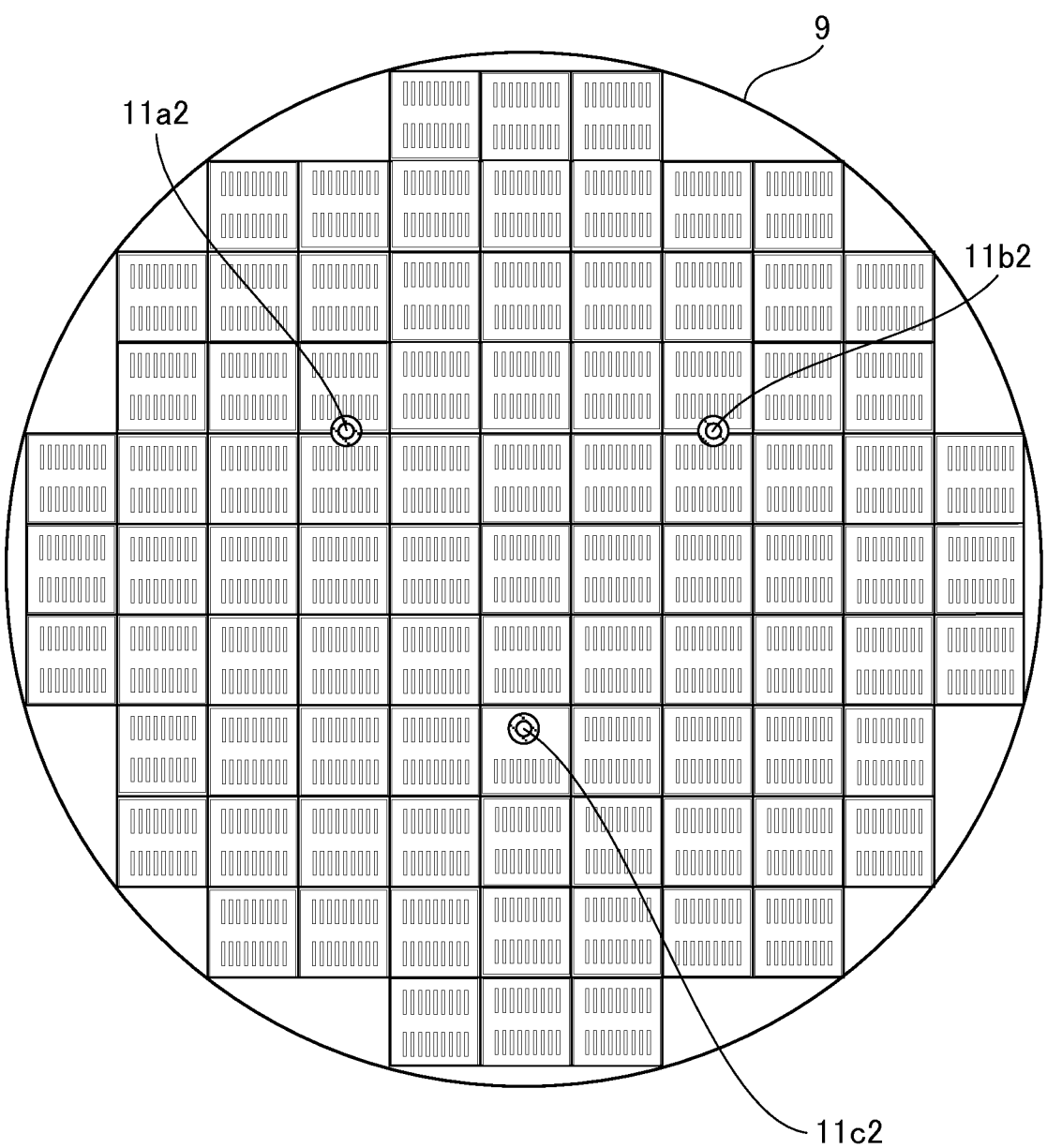
FIG. 11 illustrates still another example of a positional relation between the three pins and the through holes.

FIG. 11 illustrates still another example of the positional relation between the through holes 26 and the attracting holes 11a2, 11b2, and 11c2 in the wafer 9. In this layout of the wafer 9, the attracting holes 11a2, 11b2, and 11c2 do not overlap with the through holes 26 at all.

Figure 12:
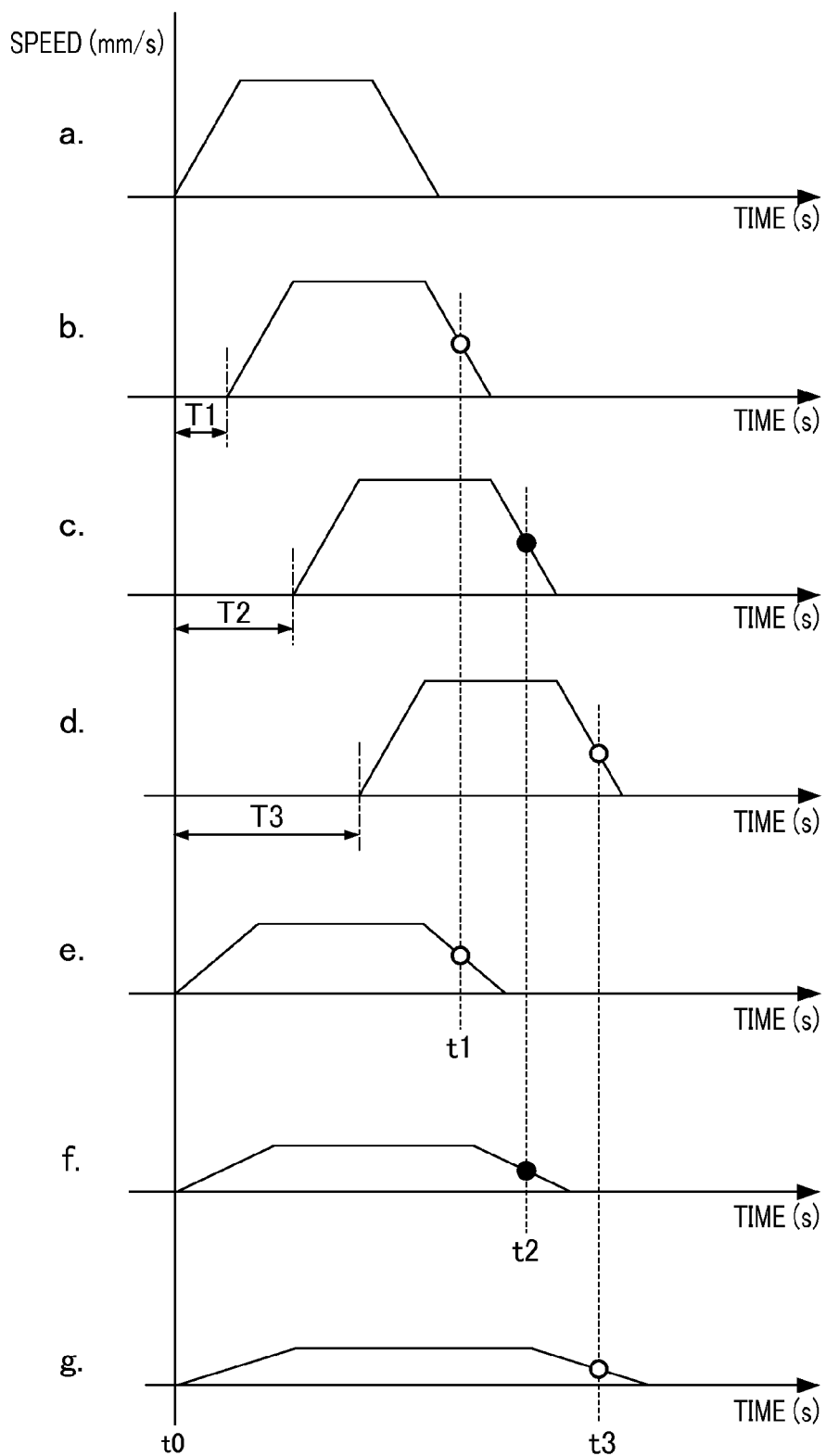
FIG. 12 illustrates an example of a control profile of the receiving arm.

FIG. 12 illustrates control profile information about the receiving arm 14, which is stored in the receiving arm control data storage unit 152. Specifically, "a" to "g" of FIG. 12 indicate the control profiles that control the operation when the receiving arm 14 is inserted between the wafer chuck 8 and the wafer 9, after t0, which is the time point that the lifting operation of the three pins 11a, 11b, and 11c has completed. These control profiles are selected by the control unit 15 based on the position information about the through holes of the wafer 9, and the details will be described below with reference to FIG. 13 to FIG. 16.

According to the control profile "a", the receiving arm 14 starts moving simultaneously with the completion of the lifting operation of the three pins 11a, 11b, and 11c, and the receiving arm 14 is inserted between the wafer chuck 8 and the wafer 9. According to the control profile "b", after the completion of the lifting operation of the three pins 11a, 11b, and 11c, the receiving arm 14 waits for only a T1 period of time, starts moving, and is inserted between the wafer chuck 8 and the wafer 9 at t1. According to the control profile "c", after the completion of the lifting operation of the three pins 11a, 11b, and 11c, the receiving arm 14 waits for only a T2 period of time, starts moving, and is inserted between the wafer chuck 8 and the wafer 9 at t2. According to the control profile "d", after the completion of the lifting operation of the three pins 11a, 11b, and 11c, the receiving arm 14 waits for only a T3 period of time, starts moving, and is inserted between the wafer chuck 8 and the wafer 9 at t3. Thus, by switching the control profiles, the insertion of the receiving arm 14 serving as the transfer unit is delayed by a predetermined time.

According to the control profile "e", at the same time as the completion of the lifting operation of the three pins 11a, 11b, and 11c, the receiving arm 14 starts the insertion between the wafer chuck 8 and the wafer 9. Although the timing of the insertion of the receiving arm 14 is the same as the control profile "a", the absolute value of the acceleration at the start of the drive of the receiving arm 14 and the acceleration at the end of the drive of the receiving arm 14 is smaller, and the duration of the uniform speed (constant speed) is longer. According to the control profile "f", the absolute value of the acceleration at the start of the drive of the receiving arm 14 and the acceleration at the end of the drive of the receiving arm 14 is smaller than the control profile "e", and the duration of the uniform speed is longer. According to the control profile "g", furthermore, the absolute value of the acceleration at the start of the drive of the receiving arm 14 and the acceleration at the end of the drive of the receiving arm 14 is smaller than the control profile "f", and the duration of the uniform speed is longer. Thus, by switching the control profiles, the acceleration or the speed of the insertion of the receiving arm 14 serving as the transfer unit is changed.

First Embodiment

Figure 13:
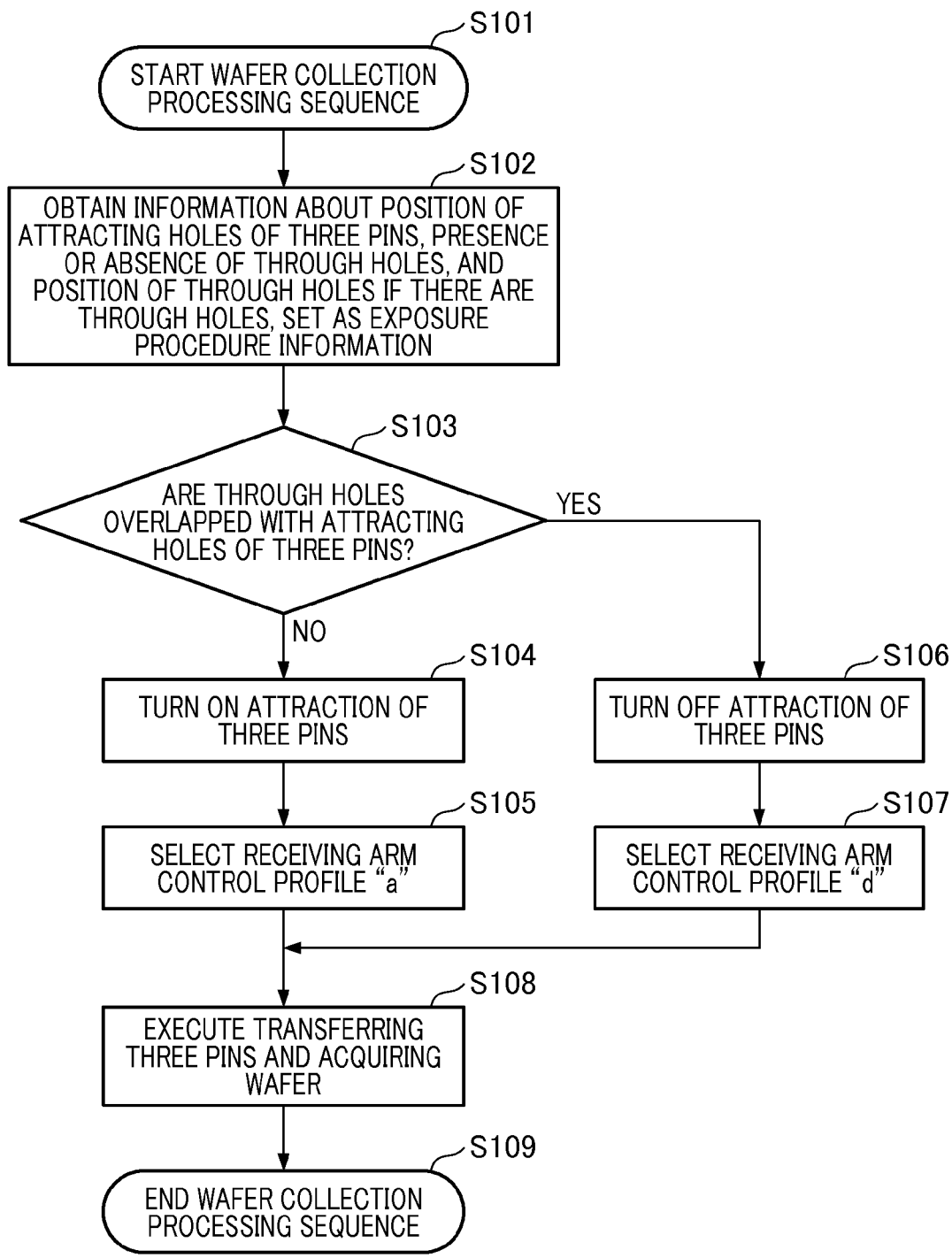
FIG. 13 is a flowchart illustrating the control of a first embodiment.

FIG. 13 is a flowchart that explains a flow of the processing that switches the control of the receiving arm 14, by using the information about the presence or absence and the positions of the through holes 26 of the wafer 9, in the processing apparatus according to the first embodiment of the present invention. The information about the presence or absence and the positions of the through holes 26 of the wafer 9 is set in advance as the exposure procedure information specified in lot units to be processed.

In S101, a wafer collection sequence starts with the wafer (substrate) for which the exposure processing on the wafer chuck 9 has ended. In S102, the control unit 15 obtains the information about the presence or absence of the through holes 26 set as the exposure procedure information stored in the through hole position information storage unit 151 and, if there are through holes, the information about the positions of the through holes. Additionally, the wafer exchange control unit 154 obtains the information about the positions of the attracting holes 11a2, 11b2, and 11c2 stored in the three pins attracting unit position information storage unit 157.

In S103, the control unit 15 determines the relation between the presence or absence and the positions of the through holes 26 and the position of the attracting holes 11a2, 11b2, and 11c2. When there are no through holes 26, or when the through holes 26 and the attracting holes 11a2, 11b2, and 11c2 do not overlap, the flow proceeds to S104. When there are the through holes 26, and when the through holes 26 and the attracting holes 11a2, 11b2, and 11c2 overlap, the flow proceeds to S106.

In S104, the control unit 15 opens the opening and closing valve 21 in order to perform the attraction using the three pins 11a, 11b, and 11c. Subsequently, in S105, the wafer exchange control unit 154 selects the control profile "a" of FIG. 12 for the receiving arm 14. In contrast, in S106, the control unit 15 closes the opening and closing valve 21 because the attraction is not performed by the three pins 11a, 11b, and 11c. Subsequently, in S107, the wafer exchange control unit 154 selects the control profile "d" of FIG. 12 for the receiving arm 14.

Subsequent to the processes of S105 or S107, in S108, in accordance with the processing shown in FIG. 4A to FIG. 4E, the receiving arm 14 receives the exposed wafer 9 disposed on the wafer chuck 8 from the three pins 11a, 11b, and 11c. When the control profile "d" is selected, the receiving arm 14 waits for only the T3 period of time, starts the insertion between the wafer chuck 8 and the wafer 9. In S109, the wafer collection processing sequence ends.

As described in the first embodiment, when there are the through holes 26 and the through holes 26 and the attracting holes 11a2, 11b2, and 11c2 overlap, the attraction by the three pins 11a, 11b, and 11c stops. In contrast, in the conventional processing apparatus, although the attraction was performed even when there are the through holes and the through holes and the attracting holes overlapped, obtaining a sufficient attracting force was impossible, the control unit determined that foreign matter has adhered to the back of the wafer, and discontinued or stopped the processing sequence. According to the present embodiment, the discontinuation or the stop of such processing sequence is prevented, and thereby throughput improves.

Additionally, according to the present embodiment, when there are the through holes 26, and the through holes 26 and the attracting holes 11a2, and the like overlap, the attracting is stopped so that the lowering of the attraction by another attracting holding mechanism connected to the identical vacuum source pressure does not occur, and consequently the reliability of the apparatus improves.

Moreover, when there are the through holes 26, and the through holes 26 and the attracting holes 11a2, 11b2, and 11c2 overlap, the control profile "d" is selected. Accordingly, the receiving arm. 14 is inserted between the wafer chuck 8 and the wafer 9 after the stabilization of the vibrations of the wafer 9, so that the damage and the positional shift of the wafer 9 due to the contact of the receiving arm 14 with the wafer 9 is prevented, and the reliability of the apparatus improves.

Furthermore, when there are no through holes 26 or the through holes 26 and attracting holes 11a2, 11b2, and 11c2 are not overlapped, the control profile "a" is selected. In this case, the attraction by the three pins 11a, 11b, and 11c is sufficiently performed, the receiving arm 14 receives the wafer 9 without a waiting time, and therefore the throughput is maintained.

Note that, in the embodiment, based on the information about the positions of the through holes 26, and the information about the position of the attracting holes 11a2, 11b2, and 11c2, the control unit 15 automatically determines whether or not the through holes and the attracting hole overlap. The present invention is not limited thereby, and it may be possible that the information about whether or not the through holes and the attracting holes overlap is set in advance as the exposure procedure information, and the information is obtained from the exposure procedure information.

Second Embodiment

Figure 14:
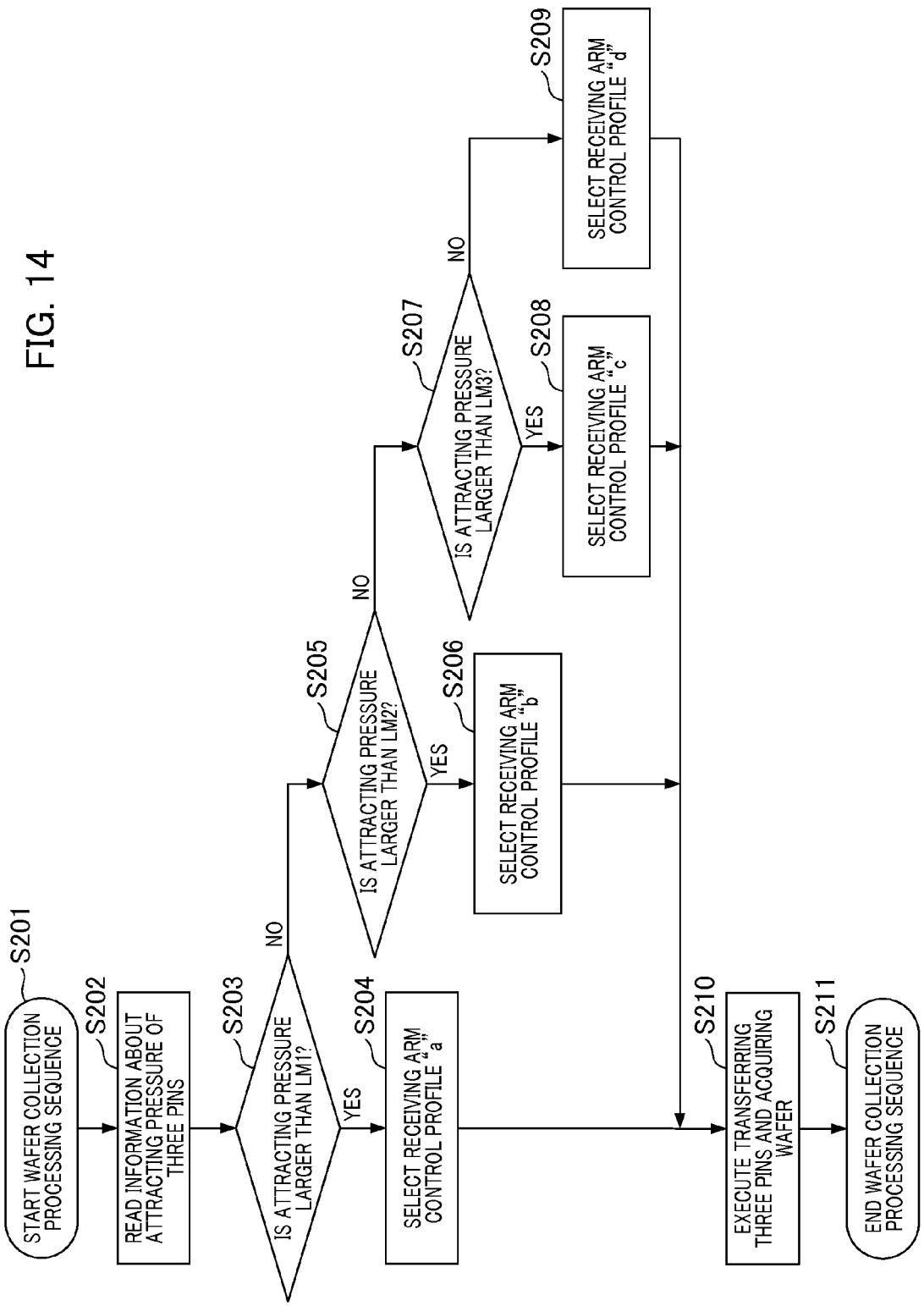
FIG. 14 is a flowchart illustrating the control of a second embodiment.

Next, a description will be given of a processing apparatus according to second embodiment of the present invention. Although a configuration of the processing apparatus according to the second embodiment is similar to that of the first embodiment, the processing that switches the control of the receiving arm 14 is different. FIG. 14 is a flowchart that explains a flow of the processing that switches the control of the receiving arm 14 based on the information about the attracting pressure, in the second embodiment.

In S201, the wafer collection sequence starts on the wafer (substrate) for which the exposure processing on the wafer chuck 9 has ended. In S202, the control unit 15 reads a pressure value from the pressure gauge 22. In S203, the control unit 15 compares and determines whether or not the attracting pressure is larger than a threshold LM1 from the pressure value that has been read. The relation of LM1>LM2>LM3 is set in advance among LM1, LM2, and LM3. When the control unit 15 determines the attracting pressure is larger than or equal to the LM1 based on the pressure value that has been read, the flow proceeds to S204. When the attracting pressure is less than the LM1, the flow proceeds to S205.

In S204, the control unit 15 selects the control profile "a" of FIG. 12 for the receiver arm 14. In contrast, in S205, the control unit 15 compares and determines whether or not the attracting pressure is larger than the threshold LM2 based on the pressure value that has been read. When the attracting pressure is larger than or equal to the LM2 in the S205, the flow proceeds to S206. When the attracting pressure is less than the LM2, the flow proceeds to S207.

In S206, the control unit 15 selects the control profile "b" of FIG. 12 for the receiver arm 14. In contrast, in S207, the control unit 15 compares and determines whether or not the attracting pressure is larger than the threshold LM3 from the pressure value that has been read. When the control unit 15 determines the attracting pressure is larger than or equal to the LM3 in the S207, the flow proceeds to S208. When the attracting pressure is less than the LM3, the flow proceeds to S209.

In S208, the control unit 15 selects the control profile "c" of FIG. 12 for the receiving arm 14. In contrast, in S209, the control unit 15 selects the control profile "d" of FIG. 12 for the receiving arm 14. In S210, in accordance with the processing shown in FIG. 4A to FIG. 4E, the receiving arm 14 receives the exposed wafer 9 that is disposed on the wafer chuck 8 from the three pins 11a, 11b, and 11c. In S211, the wafer collection process sequence ends.

As described in the second embodiment, the optimum control profile is selected for the receiving arm 14 depending on the attracting pressure, the receiving arm 14 inserts with a delay by the time required for the stabilization of the vibrations of the wafer 9. Accordingly, the useless waiting time is eliminated, and the throughput improves. Additionally, the receiving arm 14 is inserted after the stabilization of the vibrations of the wafer 9, so that the damage and the positional shift of the wafer 9 due to the contact of the receiving arm 14 with the wafer 9 is prevented, and the reliability of the apparatus improves.

Third Embodiment

Figure 15:
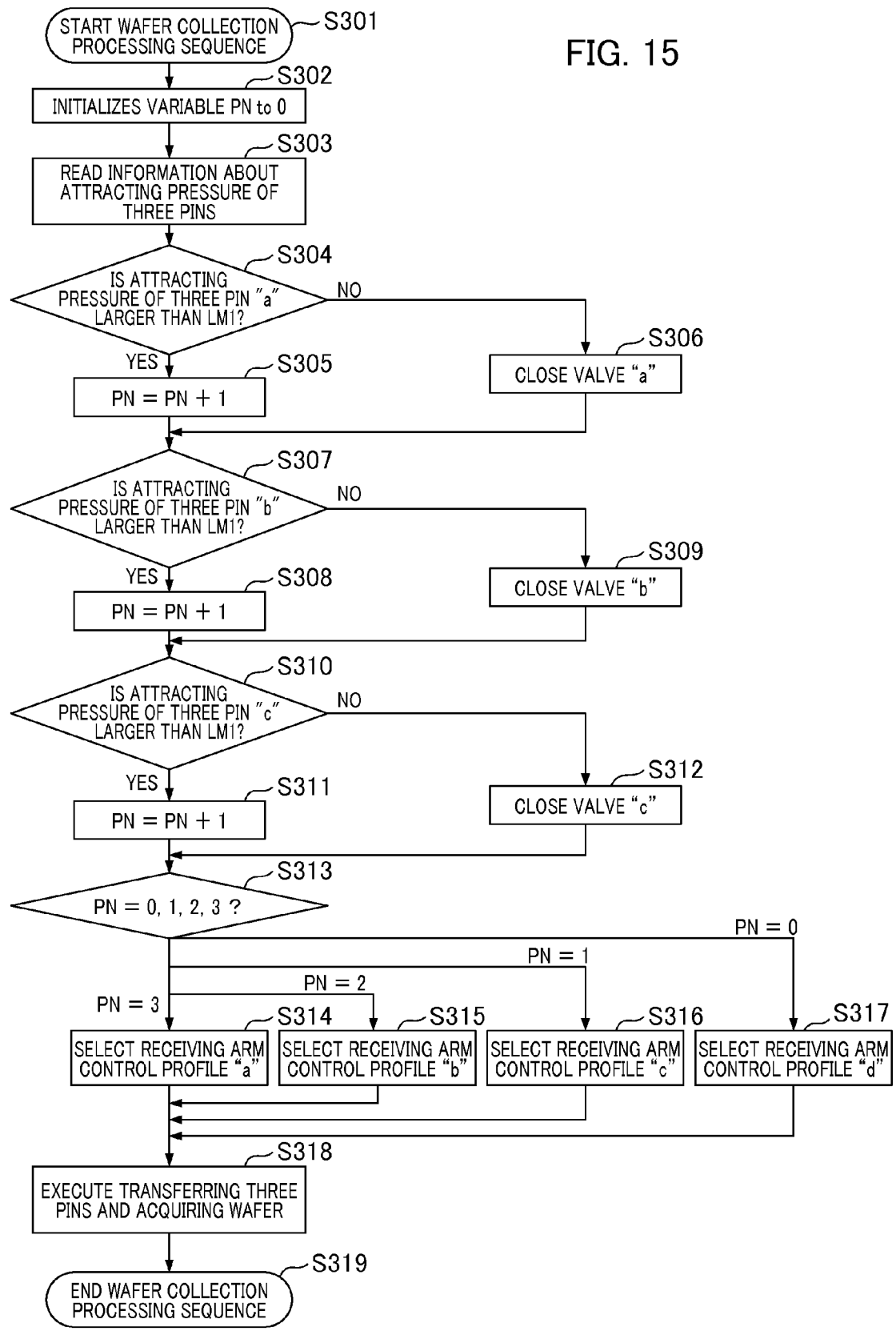
FIG. 15 is a flowchart illustrating the control of a third embodiment.

Next, a description will be given of a processing apparatus according to third embodiment of the present invention. Although a configuration of the processing apparatus according to the third embodiment is similar to the first embodiment, the apparatus includes an attracting unit shown in FIG. 2E, and furthermore, the processing that switches the control of the receiving arm 14 is different. FIG. 15 is a flow chart that explains the flow of the processing that switches the control of the receiving arm 14 based on the information about the attracting pressure in the third embodiment.

In S301, the wafer collection sequence starts with the wafer (substrate) for which the exposure processing on the wafer chuck 9 has ended. In S302, the control unit 15 initializes a variable PN for determining how many pins can be attracted among the three pins 11a, 11b, and 11c to 0. In S303, the control unit 15 reads the pressure values of the pressure gauge 22a, 22b, and 22c.

In S304, the control unit 15 determines whether or not the attracting pressure is larger than the determination threshold LM1 from the pressure value read from the pressure gauge 22a corresponding to the pin 11a. When the attracting pressure is larger than the threshold LM1, the control unit 15 adds 1 to the variable PN, in S305. In contrast, when the attracting pressure is not larger than the threshold LM1, the control unit 15 determines that the attracting hole 11a2 overlaps with the through holes 26 formed on the wafer 9, and closes the opening and closing valve 21a, in S306.

In S307, the control unit 15 determines whether or not the attracting pressure is larger than the determination threshold LM1 based on the pressure value read from the pressure gauge 22b corresponding to the pin 11b. When the attracting pressure is larger than the threshold LM1, the control unit 15 adds 1 to the variable PN, in S308. In contrast, when the attracting pressure is not larger than the threshold LM1, the control unit 15 determines that the attracting hole 11b2 overlaps with the through holes 26 formed on the wafer 9, and closes the opening and closing valve 21b, in S309.

In S310, the control unit 15 determines whether or not the attracting pressure is larger than the determination threshold LM1 based on the pressure value read from the pressure gauge 22c corresponding to the pin 11c. When the attracting pressure is larger than the threshold LM1, the control unit 15 adds 1 to the variable PN, in S311. In contrast, when the attracting pressure is not larger than the threshold LM1, the control unit 15 determines that the attracting hole 11c2 overlaps with the through holes 26 formed on the wafer 9, and closes the opening and closing valve 21c, in S312.

In S313, the control unit 15 determines that variable PN is any one of 0, 1, 2, and 3. In this case, the variable PN indicates the number of the attracting holes that are not overlapped with the through holes, among the attracting holes 11a2, 11b2, and 11c2. When the variable PN is 3, because a sufficient attracting pressure can be obtained at all of the three pins 11a, 11b, and 11c, the control unit 15 selects the control profile "a" for the receiving arm 14, in S314.

When the variable PN is 2, because a sufficient attracting pressure can be obtained at any two pins among the three pins 11a, 11b, and 11c, the control unit 15 selects the control profile "b" for the receiving arm 14, in S315. When the variable PN is 1, because a sufficient attracting pressure can be obtained at only any one pin among the three pins 11a, 11b, and 11c, the control unit 15 selects the control profile "c" for the receiving arm 14, in S316. When the variable PN is 0, because a sufficient attracting pressure cannot be obtained at all of the three pins 11a, 11b, and 11c, the control unit 15 selects the control profile "d" for the receiving arm 14, in S317.

Subsequently, in S318, in accordance with the processing shown in FIG. 4A to FIG. 4E, the receiving arm 14 receives the exposed wafer 9 disposed on the wafer chuck 8 from the three pins 11a, 11b, and 11c. In S319, the wafer collection processing sequence ends.

As described in the third embodiment, the optimum control profile is selected for the receiving arm 14 depending on the number of pins at which the attracting pressure is sufficiently generated, so that the receiving arm 14 is inserted with the delay by the time required for the stabilization of the vibrations of the wafer 9. Accordingly, the useless waiting time is eliminated, and the throughput improves. Additionally, the receiving arm 14 is inserted after the stabilization of the vibrations of the wafer 9, so that the damage and the positional shift of the wafer 9 due to the contact of the receiving arm 14 with the wafer 9 is prevented, and the reliability of the apparatus improves. Moreover, the opening and closing valves 21a, 21b and 21c corresponding to the attracting holes 11a2, 11b2, and 11c2 overlapped with the through holes 26 are closed, so that the decrease of the attraction by another attracting holding mechanism connected to the identical vacuum source pressure is prevented, and the reliability of the apparatus improves.

Fourth Embodiment

Figure 16:
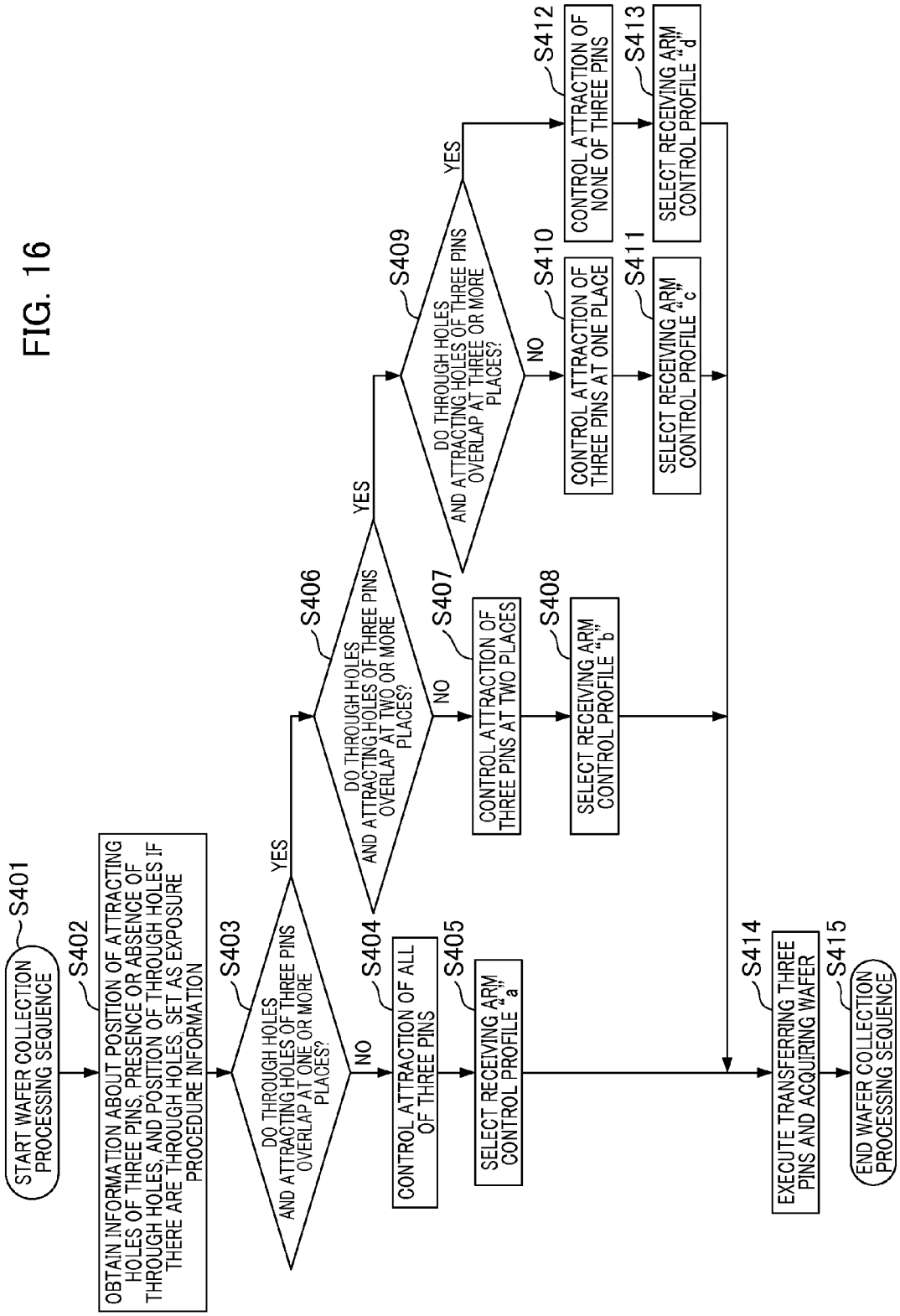
FIG. 16 is a flowchart illustrating the control of a fourth embodiment.

Next, a description will be given of a processing apparatus according to fourth embodiment of the present invention. Although a configuration of the processing apparatus according to the fourth embodiment is similar to that of the first embodiment, the processing that switches the control of the receiving arm 14 is different. FIG. 16 is a flowchart that explains the flow of processing that switches the control of the receiving arm 14 based on the information about the positions of the through holes set as the exposure procedure information specified in lot units, in the fourth embodiment.

In S401, the wafer collection sequence starts for the wafer (substrate) for which the exposure processing has ended on the wafer chuck 9. In S402, the control unit 15 obtains the information about the presence or absence of the through holes 26 set as the exposure procedure information stored in the through hole position information storage unit 151 and the information about the positions of the through holes 26 when there are through holes. Additionally, the wafer exchange control unit 154 obtains the information about the positions of the attracting holes 11a2, 11b2, and 11c2 stored in the three pins attracting unit position information storage unit 157.

In S403, the control unit 15 determines the relation between the presence or absence and the positions of the through holes 26 and the position of the attracting holes 11a2, 11b2, and 11c2. When there are no through holes 26, or when the through holes 26 are not overlapped with any of the attracting holes 11a2, 11b2, and 11c2 (the state shown in FIG. 11), the flow proceeds to S404. When there are the through holes 26, and the through holes 26 and the attracting holes 11a2, 11b2, and 11c2 are overlapped at one or more places, the flow proceeds to S406.

In S404, the control unit 15 opens all of the opening and closing valves 21a, 21b, and 21c for performing the attraction at all of the three pins 11a, 11b, and 11c. Subsequently, in S405, the control unit 15 selects the control profile "a" for the receiving arm 14.

In contrast, when the through holes 26 and the attracting holes 11a2, 11b2, and 11c2 overlap at one or more places, the control unit 15 determines the relation between the presence or absence and the positions of the through holes 26 and the position of the attracting holes 11a2, 11b2, and 11c2, in S406. When the through holes 26 and the attracting holes 11a2, 11b2, and 11c2 do not overlap at two or more places, the flow proceeds to S407. When they overlap at two or more places, the flow proceeds to S409.

In S407, with respect to the three pins 11a, 11b, and 11c, the through holes 26 and the attracting holes 11a2, 11b2, and 11c2 overlap at one place (the state shown in FIG. 9). Subsequently, one of the opening and closing valves 21a, 21b, and 21c that corresponds to one of the attracting holes that overlap is closed, and the other two opening and closing valves that corresponds to the other two attracting holes that do not overlap are opened. Subsequently, in S408, the control unit 15 selects the control profile "b" for the receiving arm 14.

In contrast, when the through holes 26 and the attracting holes 11a2, 11b2, and 11c2 are overlapped at two places or more, the control unit 15 determines the relation between the presence or absence and the positions of the through holes 26 and the position of the attracting holes 11a2, 11b2, and 11c2, in S409. When the through holes 26 and all of the three attracting holes 11a2, 11b2, and 11c2 do not overlap, the flow proceeds to S410. When the through holes 26 and all of the three attracting holes 11a2, 11b2, and 11c2 do overlap, the flow proceeds to S412.

In S410, with respect to the three pins 11a, 11b, and 11c, the through holes 26 and the attracting holes 11a2, 11b2, and 11c2 overlap at two places (the state shown in FIG. 10). Subsequently, any two of the opening and closing valves 21a, 21b and 21c that correspond to two of the attracting holes that overlap are closed, and the other one of the opening and closing valves that corresponds to the other one of the attracting holes that do not overlap is opened. Subsequently, in S411, the control unit 15 selects the control profile "c" for the receiving arm 14.

In S412, because the through holes 26 and all of the attracting holes 11a2, 11b2, and 11c2 overlap, all of the opening and closing valves 21a, 21b, and 21c are closed so as not to perform the attraction for all of the three pins 11a, 11b, and 11c. Subsequently, in S413, the control unit 15 selects the control profile "d" for the receiving arm 14.

Subsequently, in S414, in accordance with the processing shown in FIG. 4A to FIG. 4E, the receiving arm 14 receives the exposed wafer 9 disposed on the wafer chuck 8 from the three pins 11a, 11b, and 11c. In S415, the wafer collection processing sequence ends.

As described in the fourth embodiment, the attracting is performed for only the pins that do not overlap with the through holes, and the optimum control profile is selected for the receiving arm 14, and the receiving arm 14 is inserted after waiting for the time required for the stabilization of the vibration of the wafer 9. Accordingly, the useless waiting time is eliminated, and the throughput improves. Additionally, the receiving arm 14 is inserted after the stabilization of the vibrations of the wafer 9, so that the damage and the positional shift of the wafer 9 due to the contact of the receiving arm 14 with the wafer 9 is prevented, and the reliability of the apparatus improves. Moreover, the opening and closing valves 21a, 21b, and 21c corresponding to the attracting holes 11a2, 11b2, and 11c2 that overlap the through holes 26 are closed, so that the decrease of the attracting by another attracting holding mechanism connected to the identical vacuum source pressure is prevented, and the reliability of the apparatus improves.

Other Embodiments

In the first embodiment to the fourth embodiment, any one of the control the profiles "a" to "d" shown in FIG. 12 is selected as the control profile for the receiving arm 14. As a fifth embodiment, instead of this, or in addition to this, the control profile "e" may be selected in place of the control profile "b" shown in FIG. 12, the control profile "f" may be selected in place of the control profile "c", or the control profile "g" may be selected in place of the control profile "d". In the control profiles "e" to "g", the acceleration, the speed, and the duration of the moving of the receiving arm 14 is changed, and the receiving arm 14 is inserted between the wafer chuck 8 and the wafer 9 after the stabilization of the vibrations of the wafer 9, in the state similar the control profiles "b" to "d". Specifically, according to the control profile "e", after the completion of the lifting operation of the three pins 11a, 11b, and 11c, the receiving arm 14 starts moving immediately. Then, the duration is lengthened while lowering the acceleration and the speed of the movement, and the receiving arm 14 is inserted between the wafer chuck 8 and the wafer 9 at the delayed timing t1. According to the control profile "c", after the completion of the lifting operation of the three pins 11a, 11b, and 11c, the receiving arm 14 starts moving immediately. Then, the duration is further lengthened while further lowering the acceleration and the speed of the movement, the receiving arm 14 is inserted between the wafer chuck 8, and the wafer 9 at the further delayed timing t2. According to the control profile "d", after the completion of the lifting operation of the three pins 11a, 11b, and 11c, the receiving arm 14 starts moving immediately. Then, the duration is still further lengthened while still further lowering the acceleration and the speed of the movement, the receiving arm 14 is inserted between the wafer chuck 8 and the wafer 9 at the still further delayed timing t3. Thus, by switching the control profiles, the insertion of the receiving arm 14 serving as the transfer unit is delayed by a predetermined time. Consequently, the useless waiting time is eliminated, the throughput improves, the damage and the positional shift of the wafer 9 due to the contact of the receiving arm 14 with the wafer 9 are prevented, and the reliability of the apparatus improves.

Additionally, in the first to fourth embodiments, any one of the control the profiles "a" to "g" shown in FIG. 12 is selected as the control profile for the receiving arm 14. The present invention is not limited thereby, and the control profile with respect to the lifting operation of the three pins 11a, 11b, and 11c may be selected. For example, the acceleration and the speed of the lifting of the three pins 11a, 11b, and 11c are adjusted depending on the attracting pressure or the number of the attractable pins, and the vibration of the wafer 9 is set so as to fall between the upper limit of the interference limit and the lower limit of the interference limit. Accordingly, the receiving arm 14 is allowed to be inserted between the wafer chuck 8 and the wafer 9 without interfering with the wafer 9. Accordingly, the throughput improves because the useless waiting time is eliminated, the damage and the positional shift of the wafer 9 due to the contact of the receiving arm 14 with the wafer 9 are prevented, and the reliability of the apparatus improves.

Additionally, in the first embodiment to the fourth embodiment, the attraction is stopped based on the information about the through holes 26, but the present invention is not limited thereby, and the attracting force may be decreased to the extent that the decrease of the attracting by another attracting holding mechanism does not occur. Here, decreasing of the attracting force includes a case of stopping the attraction at a part of the plurality of attracting units in the third embodiment and the fourth embodiment, that is, a case of decreasing the entire attracting force at the attracting unit configured by the three pins.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-175448 filed on Aug. 29, 2014, which is hereby incorporated by reference herein in its entirety.

What is claimed is:

1. A processing apparatus that performs processing to a substrate, the processing apparatus comprising:
   a chuck disposed on a stage and that holds the substrate;
   an attracting unit that attracts the substrate and moves the substrate from the chuck; and
   a control unit configured to stop or decrease attraction of the attracting unit based on information about a through hole of the substrate in a case where the substrate is moved from the chuck by the attracting unit.

2. The processing apparatus according to claim 1, further comprising a transfer unit that is inserted between the substrate that is moved by the attracting unit and the chuck,
   wherein the control unit is configured to delay insertion of the transfer unit based on the information about the through hole of the substrate.

3. The processing apparatus according to claim 2, wherein the control unit is configured to delay the insertion of the transfer unit by delaying start timing of driving the transfer unit for the insertion.

4. The processing apparatus according to claim 2, wherein the number of the attracting unit is more than one, and wherein, in the case where the attracting unit moves the substrate from the chuck, the control unit is configured to determine the number of the attracting units overlapping the through hole, and configured to change a time for delaying the insertion of the transfer unit based on the number.

5. The processing apparatus according to claim 4, wherein the control unit is configured to change a time for delaying the insertion of the transfer unit by switching between a plurality of control profiles.

6. The processing apparatus according to claim 1, further comprising a transfer unit that is inserted between the substrate that is moved by the attracting unit and the chuck, wherein the control unit is configured to change acceleration or speed of insertion of the transfer unit based on the information about the through hole of the substrate.

7. The processing apparatus according to claim 1, wherein in the case where the attracting unit moves the substrate from the chuck, the control unit is configured to determine whether or not the through hole and the attracting unit overlap, and configured to stop or decrease attraction of the attracting unit, if the through hole and the attracting unit overlap.

8. The processing apparatus according to claim 1, wherein the number of the attracting unit is more than one, and
wherein, in the case where the attracting unit moves the substrate from the chuck, the control unit is configured to determine that the attracting unit overlaps the through hole, and configured to stop or decrease attraction of the attracting unit overlapped with the through hole.

9. The processing apparatus according to claim 1, wherein the processing includes exposure processing that exposes the substrate.

10. A processing apparatus that performs processing to a substrate, the processing apparatus comprising:
a chuck disposed on a stage and that holds the substrate;
an attracting unit that attracts the substrate and moves the substrate from the chuck;
a transfer unit that is inserted between the substrate that is moved by the attracting unit and the chuck; and
a control unit that is configured to delay insertion of the transfer unit based on information about a through hole of the substrate.

11. The processing apparatus according to claim 10, wherein the processing includes exposure processing that exposes the substrate.

12. A method for manufacturing a device, the method comprising steps of:
exposing a substrate using a processing apparatus; and
developing the exposed substrate,
wherein the processing apparatus comprises:
a chuck disposed on a stage and that holds the substrate;
an attracting unit that attracts the substrate and moves the substrate from the chuck; and
a control unit configured to stop or decrease attraction of the attracting unit based on information about a through hole of the substrate in a case where the substrate is moved from the chuck by the attracting unit.

13. A method for manufacturing a device, the method comprising steps of:
exposing a substrate using a processing apparatus; and
developing the exposed substrate,
wherein the processing apparatus comprises:
a chuck disposed on a stage and that holds the substrate;
an attracting unit that attracts the substrate and moves the substrate from the chuck;
a transfer unit that is inserted between the substrate that is moved by the attracting unit and the chuck; and
a control unit that is configured to delay insertion of the transfer unit based on information about a through hole of the substrate.

14. A method that performs processing to a substrate, the method comprising steps of:
holding the substrate by a chuck disposed on a stage;
attracting the substrate by an attracting unit and moving the substrate from the chuck; and
stopping or decreasing attraction of the attracting unit by a control unit based on information about a through hole of the substrate in a case where the substrate is moved by the attracting unit from the chuck.

15. A method that performs processing to a substrate, the method comprising steps of:
holding the substrate by a chuck disposed on a stage;
attracting the substrate by an attracting unit and moving the substrate from the chuck;
inserting the transfer unit between the substrate moved by the attracting unit and the chuck; and
delaying insertion of the transfer unit by a control unit, based on information about a through hole of the substrate.

* * * * *